US011195799B2

(12) United States Patent
Shao et al.

(10) Patent No.: US 11,195,799 B2
(45) Date of Patent: Dec. 7, 2021

(54) HYBRID READOUT PACKAGE FOR QUANTUM MULTICHIP BONDING

(71) Applicant: International Business Machines Corporation, Armonk, NY (US)

(72) Inventors: Dongbing Shao, Briarcliff Manor, NY (US); Eric Peter Lewandowski, White Plains, NY (US); Nicholas Torleiv Bronn, Long Island City, NY (US); Markus Brink, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/835,862

(22) Filed: Mar. 31, 2020

(65) Prior Publication Data

US 2021/0305165 A1    Sep. 30, 2021

(51) Int. Cl.
| | | |
|---|---|---|
| *H01L 23/538* | (2006.01) | |
| *G06N 10/00* | (2019.01) | |
| *H01L 29/66* | (2006.01) | |
| *H01L 23/498* | (2006.01) | |
| *H01L 23/00* | (2006.01) | |

(52) U.S. Cl.
CPC ......... *H01L 23/5385* (2013.01); *G06N 10/00* (2019.01); *H01L 23/49816* (2013.01); *H01L 23/49827* (2013.01); *H01L 23/5381* (2013.01); *H01L 24/13* (2013.01); *H01L 24/81* (2013.01);
(Continued)

(58) Field of Classification Search
None
See application file for complete search history.

(56) References Cited

U.S. PATENT DOCUMENTS

| | | |
|---|---|---|
| 9,620,473 B1 | 4/2017 | Hall et al. |
| 10,483,236 B2 | 11/2019 | Iwamoto |

(Continued)

FOREIGN PATENT DOCUMENTS

| | | |
|---|---|---|
| CN | 107564868 | 1/2018 |
| CN | 108470216 | 8/2018 |

(Continued)

OTHER PUBLICATIONS

Foxen et al., "Qubit compatible superconducting interconnects," arXiv:1708.04270 [quant-ph], Sep. 29, 2017, 19 pages.
Das et al., "Cryogenic Qubit Integration for Quantum Computing," 2018 IEEE 68th Electronic Components and Technology Conference, 2018, 11 pages.

(Continued)

*Primary Examiner* — Bo B Jang
(74) *Attorney, Agent, or Firm* — Amin, Turocy & Watson, LLP

(57) ABSTRACT

Systems and techniques that facilitate hybrid readout packaging for quantum multichip bonding are provided. In various embodiments, an interposer can have a first quantum chip and a second quantum chip. In various aspects, a readout resonator (e.g., input/output port) of one or more qubits on the first quantum chip can be routed to an inner portion of the interposer. In various instances, the inner portion can be located between the first quantum chip and the second quantum chip. In various aspects, routing the readout resonator to the inner portion can reduce a number of crossings and/or intersections between input/output lines on the interposer and connection buses between qubits on the interposer.

14 Claims, 13 Drawing Sheets

(52) U.S. Cl.
CPC ............... *H01L 29/66977* (2013.01); *H01L 2924/15313* (2013.01)

(56) References Cited

U.S. PATENT DOCUMENTS

| | | |
|---|---|---|
| 2018/0012932 A1 | 1/2018 | Oliver et al. |
| 2018/0013052 A1* | 1/2018 | Oliver .............. H01L 25/0652 |
| 2019/0325336 A1 | 10/2019 | Reilly |

FOREIGN PATENT DOCUMENTS

| | | |
|---|---|---|
| CN | 109148679 | 1/2019 |
| WO | 2020/036673 A2 | 2/2020 |

OTHER PUBLICATIONS

International Search Report and Written Opinion received for PCT application No. PCT/EP2021 /056078 dated Jun. 25, 2021, 13 pages.

Yost et al: "Solid-state qubits integrated with superconducting through-silicon vias", 201 Olin Library Cornell University, Dec. 23, 2019, 9 pages.

Rosenberg et al., "30 integration and packaging for solid-state qubits", arXiv:1906.11146v2 [quant-ph], Jul. 24, 2019, 22 pages.

Bronn et al., "High coherence plane breaking packaging for superconducting qubits", Quantum Science and Technology, DOI: 10.1088/2058-9565/aaa645, vol. 3, No. 2, Feb. 7, 2018, 7 pages.

* cited by examiner

ROUTING A SECOND READOUT RESONATOR OF THE FIRST QUANTUM CHIP TO A PERIPHERAL PORTION OF THE INTERPOSER, THE PERIPHERAL PORTION CIRCUMSCRIBING THE FIRST QUANTUM CHIP AND THE SECOND QUANTUM CHIP — 1002

HYBRID READOUT PACKAGE FOR QUANTUM MULTICHIP BONDING

BACKGROUND

The subject disclosure relates to readout packages for quantum chips, and more specifically to hybrid readout packages for quantum multichip bonding.

In quantum computing, larger quantum volume can be achieved for a given quantum computer by increasing the number of qubits on one or more quantum chips of the quantum computer. However, as a quantum chip grows in size to accommodate such increased numbers of qubits, more qubits can be fenced in on the quantum chip, which can result in areas of the quantum chip being overly crowded with readout lines.

Multichip bonding can address this concern by breaking up quantum chips. Quantum multichip bonding can involve multiple, smaller quantum chips being bonded to a large interposer, such that the overall interposer-quantum-chip module can accommodate increased numbers of qubits. In various cases, quantum multichip bonding can be considered as bonding multiple less-than-full-size quantum chips to an interposer, as opposed to working with full-size quantum chips that experience readout overcrowding. In various aspects, multichip bonding can result in better junction thickness control, can avoid box modes, and/or can facilitate higher yields.

However, quantum multichip bonding has its own challenges. Conventional quantum multichip bonding requires cross-chip resonators (e.g., connection buses) on (e.g., at least partly on) the interposer that couple various quantum chips together and involves wiring all readout lines of the quantum chips to a peripheral portion (e.g., periphery and/or edge region) of the interposer. When a large interposer is used, readout lines of qubits that sit near the center of the interposer can conflict (e.g., cross, intersect) with the cross-chip resonators, which can be undesirable.

A solution for quantum multichip bonding that can address (e.g., reduce) the problem of readout lines conflicting with cross-chip resonators is therefore desirable.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products that facilitate hybrid readout packaging for quantum multichip bonding are described.

According to one or more embodiments, a device is provided. The device can comprise an interposer having a first quantum chip and a second quantum chip. In various aspects, the device can further comprise a readout resonator of the first quantum chip. In various cases, the readout resonator can be routed to an inner portion of the interposer. In various embodiments, the inner portion can be located between the first quantum chip and the second quantum chip. In various embodiments, the device can further comprise at least two connection buses coupling the first quantum chip and the second quantum chip. In some cases, the at least two connection buses can be located on the inner portion. In various aspects, the readout resonator can be located between the at least two connection buses. In various embodiments, the readout resonator can be coupled to a printed circuit board by an electrical conductor that is skew to the at least two connection buses. In various embodiments, the device can further comprise a second readout resonator of the first quantum chip. In some cases, the second readout resonator can be located on a peripheral portion of the interposer, the peripheral portion circumscribing the first quantum chip and the second quantum chip.

According to one or more embodiments, a method of manufacturing the above-described device is provided.

According to one or more embodiments, an apparatus is provided. The apparatus can comprise a substrate. In some cases, the substrate can have one or more qubit chips. In various aspects, the apparatus can further comprise one or more resonators coupled to qubits of the one or more qubit chips. In various instances, the one or more resonators can be routed to one or more inner regions of the substrate. In some cases, the one or more inner regions can be positioned between one or more pairs of adjacent chips of the one or more qubit chips. In various embodiments, the one or more pairs of adjacent chips of the one or more qubit chips can be coupled together via buses positioned on the one or more inner regions. In various cases, the one or more resonators can be positioned between the buses. In various embodiments, the one or more resonators can be coupled to a printed circuit board via one or more conductors that are skew to the buses.

According to one or more embodiments, a method of manufacturing the above-described apparatus is provided.

According to one or more embodiments, an interposer is provided. In various aspects, the interposer can comprise quantum chips. In various instances, the interposer can further comprise quantum input/output (I/O) ports. In various cases, the quantum I/O ports can be routed between adjacent pairs of the quantum chips. In various embodiments, the interposer can further comprise cross-chip lines coupling the adjacent pairs of the quantum chips. In various cases, the cross-chip lines can be located between the adjacent pairs of the quantum chips. In various aspects, the quantum I/O ports can be located between the cross-chip lines. In various embodiments a printed circuit board can be coupled to the quantum I/O ports by pins that are skew to the cross-chip lines.

As mentioned above, quantum multichip bonding involves an interposer having quantum chips bonded on it, where the quantum chips are coupled together via cross-chip resonators (e.g., connection buses that run along and/or at least partly along the plane of the interposer and that couple qubits of two or more quantum chips together). In conventional quantum multichip bonding, all readout resonators (e.g., input/output ports) of the quantum chips are routed/wired to a peripheral portion of the interposer, to facilitate wire bonding and/or bump bonding of the readout resonators to a printed circuit board (e.g., the readout resonators are bonded and/or routed near the edge of the interposer so that they can be easily coupled to the printed circuit board). Conventionally, even the readout resonators of centrally-located qubits (e.g., qubits that are located near the center and/or interior of the interposer topography rather than near the periphery and/or edge of the interposer topography) are routed and/or wired to the peripheral portion of the interposer. This can cause the readout lines (e.g., that couple qubits on the quantum chips to their readout resonators/ports) to crowd, cross, intersect, and/or otherwise interfere with the cross-chip resonators. For instance, it can often be the case that any routing path from a given centrally-located qubit to the peripheral portion of the interposer is blocked by one or more cross-chip resonators, such that wiring a readout line from the given centrally-located qubit to the peripheral portion of the interposer requires the readout line to cross, intersect, and/or otherwise interfere with the one or more blocking cross-chip resonators. Such crowding, crossing, and/or intersecting can be undesirable (e.g., can make it more difficult to provide correct inputs to and/or read correct outputs from the qubits on the quantum chips).

Various embodiments of the invention can solve these problems in the prior art. In various aspects, embodiments of the invention can provide hybrid readout packages for quantum multichip bonding. In various instances, a hybrid readout package for quantum multichip bonding can include an interposer having multiple quantum chips bonded thereto, each quantum chip having one or more qubits. In various aspects, adjacent pairs of the quantum chips can be coupled together via connection buses (e.g., cross-chip resonators) that run along (e.g., at least partly along) the plane of the interposer. In various cases, peripherally-located qubits (e.g., qubits located/positioned near the periphery and/or edge of the interposer such that they have an unobstructed routing path to the periphery and/or edge of the interposer) can have readout resonators (e.g., input/output ports) that are routed/wired to a peripheral portion of the interposer. In various aspects, centrally-located qubits (e.g., qubits located/positioned away from the periphery/edge of the interposer such that they do not have an unobstructed routing path to the periphery and/or edge of the interposer) can have readout resonators that are routed/wired to inner portions of the interposer. In various instances, the inner portions of the interposer can be defined as those regions of the interposer that are substantially between adjacent pairs of quantum chips. By locating/positioning at least some readout resonators on these inner portions, the readout lines (e.g., input/output lines) associated with those readout resonators can be wired/routed to the inner portions of the interposer rather than to the peripheral portion of the interposer. As mentioned above, it can often be the case that any routing path from a given centrally-located qubit to the peripheral portion of the interposer is blocked by one or more connection buses. In various aspects, however, it can be the case that there exist one or more paths from the given centrally-located qubit to a corresponding inner portion (e.g., an inner portion of the interposer that is located between a quantum chip on which the given centrally-located qubit sits and an adjacent quantum chip) that is not blocked by one or more connection buses. Thus, in various aspects, wiring/routing at least some readout resonators to these inner portions (e.g., placing at least some input/output ports on these inner portions) can reduce an amount of crossings required to implement quantum multichip bonding, as compared to wiring all the readout resonators to the peripheral portion of the interposer. In various aspects, the amount of crossings that are reduced and/or eliminated by various embodiments of the invention can be significant and can grow as the number of quantum chips on the interposer increases. In various aspects, wiring at least some readout resonators to these inner portions can reduce an amount of routing material needed to implement quantum multichip bonding (e.g., a given centrally-located qubit can be physically closer to an associated inner portion between the quantum chip on which it sits and an adjacent quantum chip than to the peripheral portion of the interposer, such that wiring a readout line to the associated inner portion requires less wiring material than does wiring the readout line to the peripheral portion).

In various cases, a quantum chip can be bonded (e.g., bump bonded) to an interposer. In various aspects, the quantum chip can have some peripherally-located qubits on it and can have some centrally-located qubits on it. In various aspects, the peripherally-located qubits can sit on the quantum chip such that they face toward the peripheral portion of the interposer and/or have an unobstructed routing/wiring path to the peripheral portion of the interposer. That is, in various cases, there can exist a routing/wiring path from the peripherally-located qubits on the quantum chip to the peripheral portion of the interposer that do not cross one or more connection buses. In various aspects, the centrally-located qubits can sit on the quantum chip such that they face away from the peripheral portion of the interposer and/or have no unobstructed routing/wiring path to the peripheral portion of the interposer. That is, in various cases, all routing/wiring paths from the centrally-located qubits on the quantum chip to the peripheral portion of the interposer can involve crossing one or more connection buses. Thus, in some instances, it can be beneficial to wire and/or route the readout resonators of those centrally-located qubits to an associated inner portion of the interposer (e.g., to place and/or locate the input/output ports of those centrally-located qubits on an associated inner portion of the interposer), thereby avoiding the need for such crossings.

In various cases, the quantum chip can be bonded (e.g., bump bonded) to the interposer. In various cases, the resonators (e.g., buses) can be patterned by lithography on the quantum chip and the interposer before bonding, and continuous paths from qubits on the quantum chip to their readout ports can be formed after bonding the quantum chip to the interposer. In various aspects, further connections of these readout ports to the outside world can be provided as needed.

Various embodiments of the invention can provide a hybrid readout package for quantum multichip bonding, which can include one or more readout resonators (e.g., input/output ports) routed, connected, and/or wired to a peripheral portion of the interposer and one or more readout resonators (e.g., input/output ports) routed, connected, and/or wired to one or more inner portions of the interposer. Such a quantum multichip bonding structure can, in various instances, provide one or more of the following benefits and/or technical improvements. In various instances, such hybrid readout packages can be interposer-quantum-chip structures that exhibit less readout crowding (e.g., lower input/output port density at the periphery of the interposer, and/or lower input/output line density on the interposer) than conventional quantum multichip bonding. In various instances, such hybrid readout packages can be interposer-quantum-chip structures that exhibit less crossing, intersecting, and/or interference between readout lines and cross-chip resonators (e.g., fewer instances of input/output lines on the interposer conflicting with inter-qubit connection buses on the interposer) than conventional quantum multichip bonding. In various cases, such hybrid readout packages can be interposer-quantum-chip structures that provide for better utilization of chip real estate, that reduce overall crowdedness in chip design, and/or that reduce the number of crossings needed to implement multichip bonding designs. In various aspects, such benefits can scale with the number of quantum chips implemented on the interposer.

DETAILED DESCRIPTION

Figure 1:
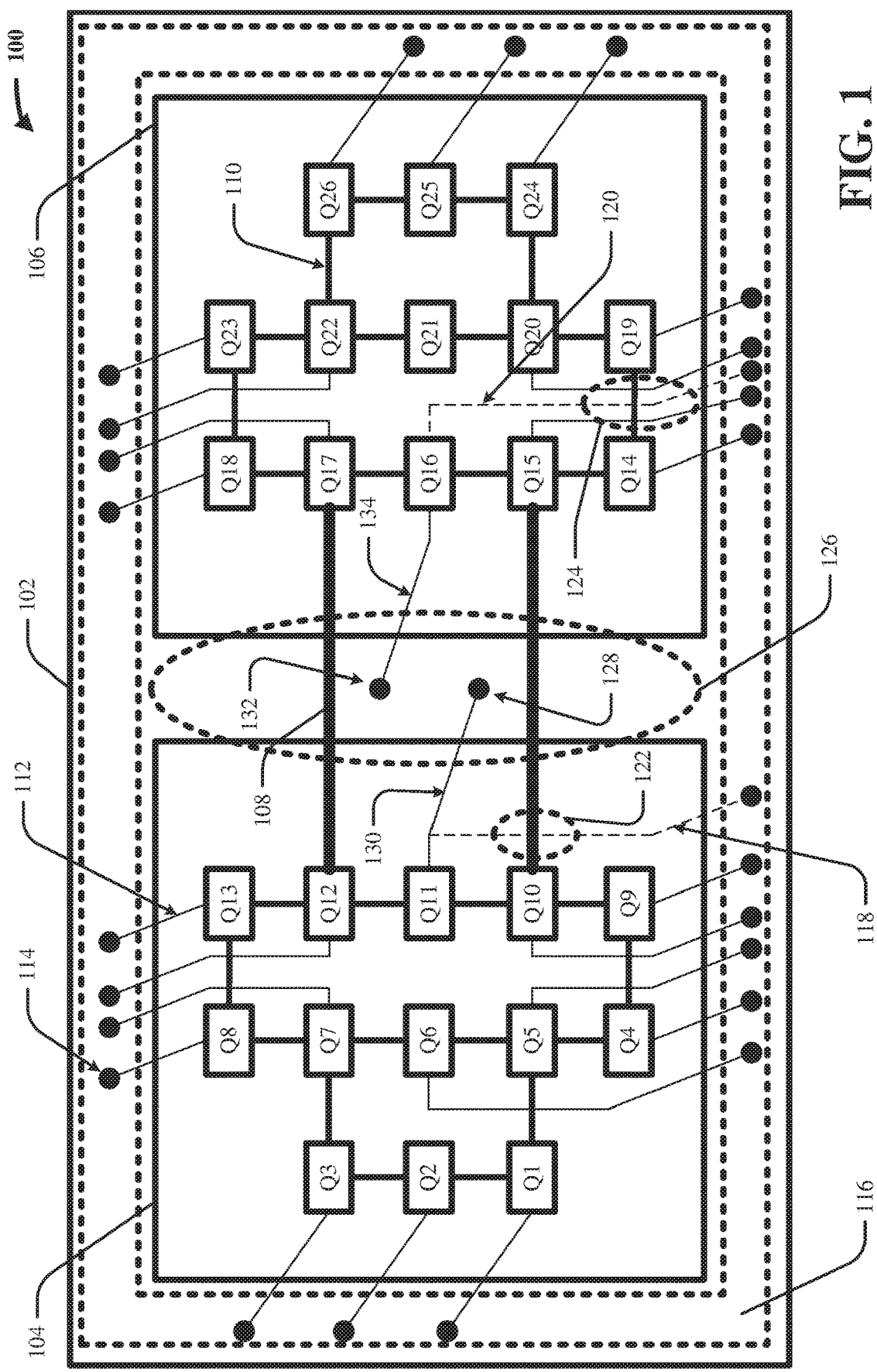
FIG. 1 illustrates a block diagram of an example, non-limiting quantum multichip bonded device that facilitates hybrid readout packaging for quantum multichip bonding in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Improvements in the processing power of quantum computers (e.g., increased quantum volume) can be facilitated by increasing a number of qubits on one or more quantum chips of a given quantum computing system. As mentioned above, however, this can cause quantum chips to grow in size such that more qubits on the quantum chip are fenced in by other qubits. The result can be overcrowded readout lines on the quantum chips.

Quantum multichip bonding can ameliorate this issue. As mentioned above, quantum multichip bonding involves bonding multiple quantum chips (e.g., less-than-full-size quantum chips) to a large interposer (e.g., a substrate which can be supported by a handler and/or stiffener) and coupling the quantum chips together via one or more connection buses (e.g., cross-chip resonators).

As explained above, quantum multichip bonding can face its own challenges. Specifically, conventional quantum multichip bonding involves wiring all readout lines (e.g., input/output lines) of the quantum chips to a peripheral portion (e.g., edge, periphery, non-central and/or non-interior region) of the interposer. This often requires the readout lines of the quantum chips to crowd, cross, intersect, and/or otherwise interfere with the cross-chip resonators, which can make it difficult to properly perform quantum readout.

Various embodiments of the invention can reduce the number of such crossings in quantum multichip bonding. Specifically, various embodiments of the invention can provide hybrid readout packages for quantum multichip bonding (e.g., interposer-quantum-chip structures) that require fewer crossings between readout lines and cross-chip resonators than conventional quantum multichip bonding, thereby providing improved performance.

In various aspects, a hybrid readout package for quantum multichip bonding can involve an interposer having quantum chips bonded on it, where adjacent quantum chips can be coupled together via one or more connection buses (e.g., cross-chip resonators). For brevity and ease of explanation, the herein disclosure explicitly discusses and depicts embodiments of interposers containing rectangular arrays of quantum chips. However, it is to be appreciated that, in various embodiments, the quantum chips can be arranged on the interposer in any suitable shape, pattern, and/or fashion.

In various instances, the interposer can have peripherally-located quantum chips and centrally-located quantum chips. In various aspects, a peripherally-located quantum chip can be a quantum chip that is adjacent to the peripheral portion of the interposer and/or a quantum chip that is not separated from the peripheral portion of the interposer by one or more other quantum chips. In various aspects, a centrally-located quantum chip can be a quantum chip that is not adjacent to the peripheral portion of the interposer and/or a quantum chip that is separated from the peripheral portion of the interposer by one or more other quantum chips. For example, consider a five-by-six array of quantum chips bonded to an interposer (e.g., 30 quantum chips in total). In various aspects, the 18 quantum chips that make up the perimeter of the five-by-six array can be considered peripherally-located quantum chips, because, for each of those 18 quantum chips, no other quantum chip is between it and the peripheral portion of the interposer. In various aspects, the 12 quantum chips in the interior of the five-by-six array can be considered centrally-located quantum chips, because, for each of those 12 quantum chips, at least one other quantum chip is between it and the peripheral portion of the interposer.

In various instances, adjacent quantum chips on the interposer can be coupled together by one or more connection buses (e.g., also referred to as cross-chip resonators). In various instances, the one or more connection buses can be located on and/or at least partly on the interposer (e.g., can run on and/or at least partly on the plane of the interposer) and can couple adjacent pairs of the quantum chips together (e.g., can couple qubits on a quantum chip to qubits on an adjacent quantum chip). For instance, consider the above example with an interposer having a five-by-six array of quantum chips. In various cases, each of the 12 centrally-located quantum chips can be coupled to four (and/or fewer) quantum chips, since each of the 12 centrally-located quantum chips is adjacent to four other quantum chips. In various cases, the four quantum chips that make up the corners of the five-by-six array (e.g., four of the 18 peripherally-located quantum chips) can be coupled to two (and/or fewer) quantum chips, since each of those four corner quantum chips is adjacent to two other quantum chips. In various cases, the remaining 14 peripherally-located quantum chips can be coupled to three (and/or fewer) quantum chips, since each of those 14 peripherally-located quantum chips is adjacent to three other quantum chips. In various embodiments, any suitable quantum chip on the interposer can be coupled to any suitable number of any other suitable quantum chips on the interposer (e.g., in some cases, a quantum chip can be coupled to more than four other quantum chips; in some cases, non-adjacent quantum chips can be coupled together).

In various instances, each quantum chip can have one or more qubits, with each qubit being associated with and/or corresponding to a readout resonator (e.g., an input/output port to provide input to and/or receive output from the qubit) that is bonded to the interposer. For instance, a first quantum chip on the interposer can have, in some cases, 29 qubits. In various aspects, each of those 29 qubits can have a corresponding readout resonator (e.g., input/output port) bonded to the interposer, for a total of 29 readout resonators (e.g., 29 input/output ports) corresponding to the first quantum chip. A second quantum chip on the interposer can have, in some cases, 13 qubits. In various instances, each of those 13 qubits can have a corresponding readout resonator (e.g., input/output port) bonded to the interposer, for a total of 13 readout resonators (e.g., 13 input/output ports) corresponding to the second quantum chip. In various aspects, each qubit can be coupled to its corresponding readout resonator by a readout line (e.g., input/output line). In various cases, each readout line can be located on the interposer (e.g., can run on the plane of the interposer). As mentioned above, various embodiments of the invention can reduce a number of crossings and/or interferences between these readout lines and the connection buses, as compared to conventional quantum multichip bonding.

In some instances, an input (e.g., drive) to a qubit and an output (e.g., readout) from a qubit can be combined in a single line and routed/wired to the same port on the interposer. In other instances, the input (e.g., drive) to the qubit and the output (e.g., readout) from the qubit can be on different lines and can thus be routed/wired to separate ports on the interposer. In various instances, the readouts of two or more qubits can be combined and routed/wired to a single port on the interposer (e.g., a readout port on the interposer chip can connect to more than one qubit by means of multiplexing).

In various aspects, the interposer can have a peripheral portion and one or more inner portions. In various instances, the peripheral portion can be an edge, periphery, and/or non-interior region of the interposer that circumscribes and/or surrounds the quantum chips on the interposer. In various instances, the one or more inner portions can be those regions of the interposer that are located between adjacent pairs of quantum chips. Consider the above example with an interposer having a five-by-six array of quantum chips. In some cases, the peripheral portion can be an edge and/or periphery of the interposer (e.g., a rectangular annulus of the interposer) that substantially circumscribes the five-by-six array of quantum chips. In some cases, the five-by-six array of quantum chips can define 49 inner portions of the interposer (e.g., there can be 49 regions of the interposer that are physically between and/or physically sandwiched by two adjacent quantum chips in the five-by-six array of quantum chips).

In various embodiments, the readout resonators corresponding to the centrally-located quantum chips can be routed/wired to the interposer at the one or more inner portions (e.g., the input/output ports of the centrally-located quantum chips can be placed, located, positioned, and/or bonded to the interposer at the one or more inner portions), rather than at the peripheral portion. This can reduce a number of crossings needed to couple the qubits of the centrally-located quantum chips to their corresponding readout resonators. For instance, consider the five-by-six array of quantum chips from the above examples. Specifically, consider a first quantum chip at position (2, 3) (e.g., second row from the top, third column from the left) in the five-by-six array and a second quantum chip at position (2, 4) in the five-by-six array. Suppose that the first and second quantum chips are coupled by one or more connection buses. The first and second quantum chips are centrally-located and are adjacent to each other. In various aspects, there can exist an inner portion of the interposer that is physically between the first quantum chip and the second quantum chip (e.g., the surface of the interposer that is substantially physically bounded in one direction by position (2,3) and position (2,4) and substantially physically bounded in an orthogonal direction by the width of the first and second quantum chips). In various aspects, a readout resonator of the first quantum chip can be routed and/or wired to the interposer at this inner portion (e.g., an input/output port of the first quantum chip can be placed between the first quantum chip and the second quantum chip). Since the path from the first quantum chip to the inner portion can be unobstructed (e.g., the first quantum chip is directly adjacent to the inner portion, and there are no other quantum chips between the first quantum chip and the inner portion), the first quantum chip can be coupled to the readout resonator without crossing the connection buses that couple the first quantum chip to the second quantum chip and without crossing any other connection buses on the interposer. The conventional alternative, in contrast, is to wire/route the readout resonator of the first quantum chip to the peripheral portion of the interposer. However, this can require crossing the connection buses that couple the first and second quantum chips, as well as crossing other connection buses that couple together other quantum chips on the interposer. After all, since the first quantum chip is centrally-located, a readout line from the first quantum chip to the peripheral portion will have to cross connection buses of qubits that are in higher-numbered and/or lower-numbered rows and/or high-numbered and/or lower-numbered columns (e.g., to get from position (2,3) to the peripheral portion requires either traversing the one row of quantum chips above position (2,3), traversing the three rows of quantum chips below position (2,3), traversing the two columns of quantum chips to the left of position (2,3), or traversing the three columns of quantum chips to the right of position (2,3)). By wiring/routing the readout resonators to these inner portions of the interposer, a number of crossings between readout lines and connection buses can be reduced. Since crossings, intersections, and/or interferences of the readout lines with the connection buses can make efficacious qubit readout difficult and/or tricky, reducing the number of crossings constitutes a technical improvement over conventional quantum multichip bonding.

In various aspects, some readout resonators corresponding to the peripherally-located quantum chips can be routed/wired to the peripheral portion of the interposer (e.g., some qubits of a peripherally-located quantum chip can have an unobstructed path to the peripheral portion; such qubits can be referred to as peripherally-located qubits, and in such cases, routing/wiring the readout resonators of those peripherally-located qubits to the peripheral portion of the interposer can be acceptable). In various aspects, some readout resonators of the peripherally-located quantum chips can be routed/wired to the one or more inner portions (e.g., some qubits of a peripherally-located quantum chip can face away from the peripheral portion such that they do not have unobstructed paths to the peripheral portion; such qubits can be referred to as centrally-located qubits, and in such cases, the readout resonators of those centrally-located qubits can be routed/wired to suitable inner portions of the interposer). In various aspects, the centrally-located quantum chips can have only centrally-located qubits (e.g., qubits that do not have unobstructed paths to the peripheral portion of the interposer). In various aspects, the peripherally-located quantum chips can have both centrally-located qubits (e.g., qubits that do not have unobstructed paths to the peripheral portion of the interposer) and peripherally-located qubits (e.g., qubits that do have unobstructed paths to the peripheral portion of the interposer).

In various embodiments, the readout resonators on the interposer can be coupled to a printed circuit board (e.g., coupled to electrodes of the printed circuit board) by any suitable electrical coupling technique (e.g., wire bonding and/or bump bonding). In various aspects, the readout resonators of centrally-located qubits can be coupled to the printed circuit board by electrical conductors that are skew to the connection buses on the interposer (e.g., the electrical conductors can be substantially orthogonal to the interposer and/or can extend out of and/or away from the interposer so as to not intersect any connection buses). In various instances, the electrical conductors can be pogo pins, land grid arrays, through-silicon vias, and/or any other suitable electrical conductor and/or combination of electrical conductors.

Various embodiments of the invention include novel physical structures of quantum multichip bonding modules that are not abstract, that are not natural phenomena, that are not laws of nature, and that cannot be performed as a set of mental acts by a human. Instead, various embodiments of the invention include physical designs of quantum multichip bonding modules that provide improved quantum readout by reducing a number of crossings and/or intersections between quantum readout lines (e.g., input/output lines) and quantum connection buses (e.g., cross-chip resonators), as compared to conventional quantum multichip bonding. Since such crossings can reduce the efficacy of quantum readout, chip designs that eliminate and/or reduce such crossings can improve the functioning of quantum computing systems (e.g., improving the efficacy and/or accuracy of quantum readout), and thereby constitute concrete technical improvements over the prior art. Various embodiments of the invention can accomplish this technical improvement by providing a hybrid readout package for quantum multichip bonding. In various aspects, readout resonators of centrally-located qubits can be positioned on and/or routed/wired to an interposer at one or more inner portions of the interposer. The inner portions can be defined as those regions of the interposer's surface that are physically between adjacent quantum chips. Since there can be an unobstructed path from a centrally-located qubit to at least one of these inner portions, a readout line coupling the qubit to its readout resonator at one of the inner portions need not cross and/or intersect any connection buses on the interposer. In contrast, conventional quantum multichip bonding requires all readout resonators to be positioned on and/or wired/routed to a peripheral portion of the interposer. In some cases, there can be no unobstructed paths to the peripheral portion from at least one centrally-located qubit. In such case, wiring all readout lines to the peripheral portion can require a larger number of crossings, which can be undesirable. Thus, embodiments of the invention provide a novel hybrid readout package for quantum multichip bonding that improves the functioning of quantum computing systems, and thereby constitutes a concrete technical improvement over the prior art.

In various aspects, it should be appreciated that the figures of this disclosure are exemplary and non-limiting only and are not necessarily drawn to scale.

FIG. 1 illustrates a block diagram of an example, non-limiting quantum multichip bonded device 100 that can facilitate hybrid readout packaging for quantum multichip bonding in accordance with one or more embodiments described herein. As shown, an interposer 102 can have a first quantum chip 104 bonded to the interposer 102 and a second quantum chip 106 bonded to the interposer 102. In various instances, the first quantum chip 104 and the second quantum chip 106 can be bump bonded to the interposer 102. In various aspects, any other suitable bonding technique can be implemented.

As shown, the first quantum chip 104 can, in various cases, comprise one or more qubits (e.g., qubits Q1 to Q13), and the second quantum chip 106 can, in various aspects, comprise one or more qubits (e.g., qubits Q14 to Q26). In various instances, any suitable types and/or any suitable number of qubits can be on the first quantum chip 104, and any suitable types and/or any suitable number of qubits can be on the second quantum chip 106. In various instances, the qubits Q1 to Q13 can be arranged in any suitable pattern, shape, and/or fashion on the first quantum chip 104. In various instances, the qubits Q14 to Q26 can be arranged in any suitable pattern, shape, and/or fashion on the second quantum chip 106.

In various instances, the first quantum chip 104 can be communicatively coupled to the second quantum chip 106 by one or more connection buses 108 (e.g., which can be cross-chip resonators). In the non-limiting example depicted, there are two connection buses 108 coupling the first quantum chip 104 to the second quantum chip 106 (e.g., a first connection bus 108 coupling Q12 to Q17, and a second connection bus 108 coupling Q10 to Q15). In various instances, any suitable types and/or any suitable number of connection buses 108 can couple the first quantum chip 104 to the second quantum chip 106. As shown, a portion of the one or more connection buses 108 can run along the surface of the interposer 102. In various embodiments, the one or more connection buses 108 can comprise any suitable materials for communicatively and/or electrically coupling qubits and/or quantum chips.

In various instances, the qubits Q1 to Q13 of the first quantum chip 104 can be communicatively coupled to each other in any suitable arrangement by one or more inter-qubit connectors 110. Similarly, the qubits Q14 to Q26 of the second quantum chip 106 can be coupled to each other in any suitable arrangement by one or more inter-qubit connectors 110. In various aspects, the one or more inter-qubit connectors 110 can comprise any suitable materials for electrically and/or communicatively coupling qubits. As shown, in various instances, the one or more inter-qubit connectors 110 can run along the surfaces of the first quantum chip 104 and the second quantum chip 106, rather than on the surface of the interposer 102.

In various instances, each of the qubits Q1 to Q13 of the first quantum chip 104 can have an associated and/or corresponding readout resonator 114 (e.g., which can be an input/output port for providing input to and/or receiving output from each qubit). Similarly, each of the qubits Q14 to Q26 of the second quantum chip 106 can have an associated and/or corresponding readout resonator 114 (e.g., input/output port) In various embodiments, the one or more readout resonators 114 can comprise any suitable materials for facilitating provision and/or receipt of quantum input and output. In various aspects, each qubit Q1 to Q26 can have one corresponding readout resonator 114. In various aspects, each qubit Q1 to Q26 can have any suitable number and/or any suitable types of readout resonators 114.

In various instances, each qubit Q1 to Q26 can be coupled to its corresponding readout resonator 114 by a readout line 112 (e.g., which can be an input/output line). In various aspects, the readout lines 112 can comprise any suitable materials for communicatively and/or electrically coupling qubits to readout resonators. As shown, the readout lines 112 can, in various cases, have portions that run along the surfaces of the first quantum chip 104 and the second quantum chip 106, as well as portions that run along the surface of the interposer 102.

As mentioned above, conventional quantum multichip bonding involves routing/wiring all the readout resonators 114 to a peripheral portion 116 of the interposer 102 (e.g., the peripheral portion 116 is designated in FIG. 1 as the surface area of the interposer 102 that is between the two dotted, concentric, axis-parallel rectangles). As shown, the peripheral portion 116 can be a physical region and/or portion of the surface area of the interposer 102 that is an edge and/or periphery of, and/or that is near an edge and/or periphery of, the interposer 102. In various aspects, the interposer 102 can comprise any suitable shape (e.g., rectangular chip, circular chip, triangular chip, and/or any other suitably-shaped chip). In various aspects, the peripheral portion 116 can be an annular surface area corresponding to the shape of the interposer 102 (e.g., a rectangular annulus for a rectangular interposer 102, a circular annulus for a circular interposer 102, a triangular annulus for a triangular interposer 102).

As shown, some of the readout resonators 114 can be routed/wired to the peripheral portion 116 of the interposer 102 (e.g., some of the readout resonators 114 can be located, positioned, situated, and/or bonded on the peripheral portion 116). Thus, the readout lines 112 of those readout resonators 114 can be routed to the peripheral portion 116 in order to couple the readout resonators 114 to their corresponding qubits. As shown, this can be unproblematic for qubits that face the peripheral portion 116 and/or for qubits that otherwise have an unobstructed path to the peripheral portion 116 (e.g., for peripherally-located qubits). For instance, qubits Q1, Q2, Q3, Q4, Q8, Q9, and Q13 of the first quantum chip 104 are all facing the peripheral portion 116 and have an unobstructed path to the peripheral portion 116 (e.g., the readout lines 112 from the qubits Q1, Q2, Q3, Q4, Q8, Q9, and Q13 can be routed to the peripheral portion 116 without crossing the connection buses 108 and/or the inter-qubit connectors 110). Similarly, qubits Q14, Q18, Q19, Q23, Q24, Q25, and Q26 of the second quantum chip 106 are all facing the peripheral portion 116 and have an unobstructed path to the peripheral portion 116 (e.g., the readout lines 112 from the qubits Q14, Q18, Q19, Q23, Q24, Q25, and Q26 can be routed to the peripheral portion 116 without crossing the connection buses 108 and/or the inter-qubit connectors 110). In various cases, the qubits Q1, Q2, Q3, Q4, Q8, Q9, Q13, Q14, Q18, Q19, Q23, Q24, Q25, and Q26 can be considered peripherally-located qubits. However, the qubits Q6 and Q11 of the first quantum chip 104 and the qubits Q16 and Q21 of the second quantum chip 106 do not have such unobstructed paths to the peripheral portion 116 (e.g., they can be considered centrally-located qubits). Thus, the readout lines 112 from the qubits Q6, Q11, Q16, and Q21 all must cross, intersect, and/or otherwise interfere with at least one connection bus 108 and/or at least one inter-qubit connector 110 in order to be routed to the peripheral portion 116.

Specifically, consider qubit Q11 of the first quantum chip 104 and qubit Q16 of the second quantum chip 106. As shown by the dotted numeral 118, if the readout resonator 114 of the qubit Q11 were wired/routed to the peripheral portion 116, the readout line of qubit Q11 would have to cross either at least one connection bus 108 (e.g., which crossing is designated as numeral 122 in FIG. 1) or at least one inter-qubit connector 110. Similarly, as shown by the dotted numeral 120, if the readout resonator 114 of the qubit Q16 were wired/routed to the peripheral portion 116, the readout lines of qubit Q16 would have to cross either at least one connection bus 108 or at least one inter-qubit connector 110 (e.g., which crossing is designated as numeral 124 in FIG. 1). Moreover, numeral 124 shows the crowding of the readout lines 112 that can result if the readout resonator 114 of the qubit Q16 is routed/wired to the peripheral portion 116. Overall, these crossings can be problematic (e.g., can make it difficult to accurately provide input to and/or receive output from the qubits on the quantum chips).

As shown, in various embodiments, some of the readout resonators 114 can be routed/wired to the inner portion 126 of the interposer 102. In various aspects, the inner portion 126 can be the region and/or surface area of the interposer 102 that is physically between and/or sandwiched by the first quantum chip 104 and the second quantum chip 106. As shown, the readout resonator 114 of the qubit Q11 (e.g., denoted as readout resonator 128) can be located/positioned on the inner portion 126. As shown, the readout line 112 of the qubit Q11 (e.g., denoted as readout line 130) can be routed so as to couple the qubit Q11 to the readout resonator 128. Similarly, as shown, the readout resonator 114 of the qubit Q16 (e.g., denoted as readout resonator 132) can be located/positioned on the inner portion 126. As shown, the readout line 112 of the qubit Q16 (e.g., denoted as readout line 134) can be routed so as to couple the qubit Q16 to the readout resonator 132.

As explained above, routing/wiring the readout of the qubit Q11 to the peripheral portion 116 (e.g., denoted by dotted numeral 118) can cause the readout line of the qubit Q11 to cross at least one of the connection buses 108 (e.g., denoted by numeral 122). Similarly, routing/wiring the readout of the qubit Q16 to the peripheral portion 116 (e.g., denoted by dotted numeral 120) can cause the readout line of the qubit Q16 to cross and/or crowd at least one of the inter-qubit connectors 110 (e.g., denoted by numeral 124). As shown, however, the crossings denoted by numerals 122 and 124 can be eliminated and/or avoided by wiring/routing the readout resonator 128 and the readout resonator 132 to the inner portion 126. Indeed, as shown, the readout line 130 can avoid crossing the connection buses 108 and/or the inter-qubit connectors 110, and the readout line 134 can similarly avoid crossing the connection buses 108 and/or the inter-qubit connectors 110. This can be achieved because the qubits Q11 and Q16 can have unobstructed paths (e.g., a path that is not blocked by at least one connection bus 108 and/or at least one inter-qubit connector 110) to the inner portion 126 and can lack unobstructed paths to the peripheral portion 116. Thus, in various aspects, wiring and/or routing at least one readout resonator 114 of the first quantum chip 104 and/or the second quantum chip 106 to the inner portion 126 can facilitate a reduction in the number of crossings needed to implement quantum multichip bonding. Since crossings can be detrimental to the accuracy of quantum input/output, chip designs that reduce the number of crossings can improve the performance of quantum computing systems, thereby constituting concrete technical improvements over the prior art.

In various embodiments, as shown, at least two connection buses 108 can couple the first quantum chip 104 to the second quantum chip 106. In various aspects, the at least two connection buses 108 can be located on the inner portion 126 of the interposer 102. In various instances, the readout resonator 128 and/or the readout resonator 132 can be located/positioned/bonded to the interposer 102 at the inner portion 126, such that the readout resonator 128 and/or the readout resonator 132 are located/positioned between the at least two connection buses 108.

In various embodiments, the readout resonator 128 and/or the readout resonator 132 can be coupled to a printed circuit board (e.g., to one or more electrodes of the printed circuit board) by electrical conductors (shown later in FIGS. 4-6). In various aspects, the electrical conductors can be skew (e.g., non-parallel and non-intersecting) to the at least two connection buses 108. In various aspects, the electrical conductors can extend out and/or away from the interposer 102 (e.g., can extend out of the page of FIG. 1) such that the electrical conductors are substantially orthogonal and/or perpendicular to the interposer 102.

In various aspects, readout resonators 114 can be routed and/or wired to the peripheral portion 116 or the inner portion 126 in order to minimize a number of crossings between readout lines 112 and connection buses 108 and/or between readout lines 112 and inter-qubit connectors 110. For instance, some of the readout resonators 114 can be routed and/or wired to the peripheral portion 116 (e.g., readout resonators 114 of peripherally-located qubits that have an unobstructed path to the peripheral portion 116, and/or readout resonators 114 for qubits that have no path to the inner portion 126 that involves fewer crossings). Thus, in various instances, a hybrid readout package for quantum multichip bonding can include routing some readout resonators 114 to the peripheral portion 116 and can include routing other readout resonators 114 to the inner portion 126, so as to reduce a number of crossings between readout lines 112 and connection buses 108 and/or between readout lines 112 and inter-qubit connectors 110. Moreover, such a design can reduce the density of readout resonators 114 located on the peripheral portion 116. In contrast, conventional quantum multichip bonding involves wiring all readout resonators 114 to the peripheral portion 116, which can result in a higher number of undesirable crossings between readout lines 112 and connection buses 108 and/or between readout lines 112 and inter-qubit connectors 110, and which can result in overcrowding and/or increased density of readout resonators 114 on the peripheral portion 116. In various aspects, the benefits and/or technical improvements that can be facilitated by the disclosed hybrid readout packages for quantum multichip bonding can scale with the number of quantum chips. For instance, the number of crossings in conventional designs increases rapidly as the number of quantum chips on the interposer increases (e.g., more quantum chips can be fenced in and/or centrally-located on the interposer), which can mean that more and more crossings can be eliminated/avoided by implementing hybrid readout packages with interposers that have large numbers of quantum chips.

Figure 2:
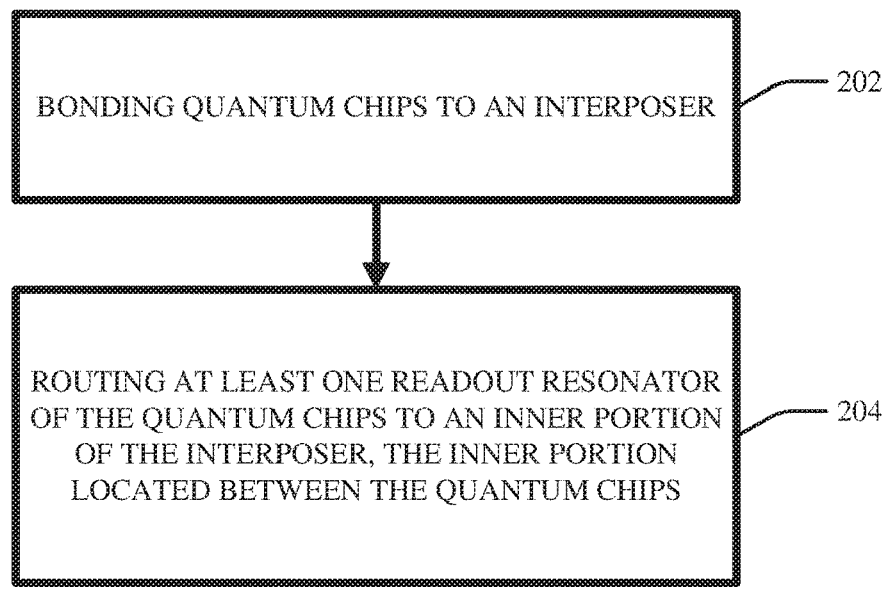
FIG. 2 illustrates a flow diagram of an example, non-limiting method of manufacturing a quantum multichip bonded device that facilitates hybrid readout packaging for quantum multichip bonding in accordance with one or more embodiments described herein.

FIG. 2 illustrates a flow diagram of an example, non-limiting method 200 of manufacturing a quantum multichip bonded device that can facilitate hybrid readout packaging for quantum multichip bonding in accordance with one or more embodiments described herein. In various aspects, the method 200 can be used to create the device 100. In various embodiments, act 202 can include bonding quantum chips (e.g., 104 and/or 106) to an interposer (e.g., 102). In various embodiments, act 204 can include routing and/or wiring at least one readout resonator (e.g., 128/130 and/or 132/134) of the quantum chips to an inner portion (e.g., 126) of the interposer (e.g., placing at least one input/output port on the inner portion), the inner portion located between the quantum chips. As mentioned above, constructing/creating quantum multichip bonding modules in this way can reduce a number of crossings between input/output lines (e.g., readout lines) of the quantum chips and connection buses (e.g., cross-chip resonators) of the quantum chips. Reducing the number of such crossings can improve the accuracy and/or efficacy of quantum readout, which can improve the functioning of quantum computing systems.

Figure 3:
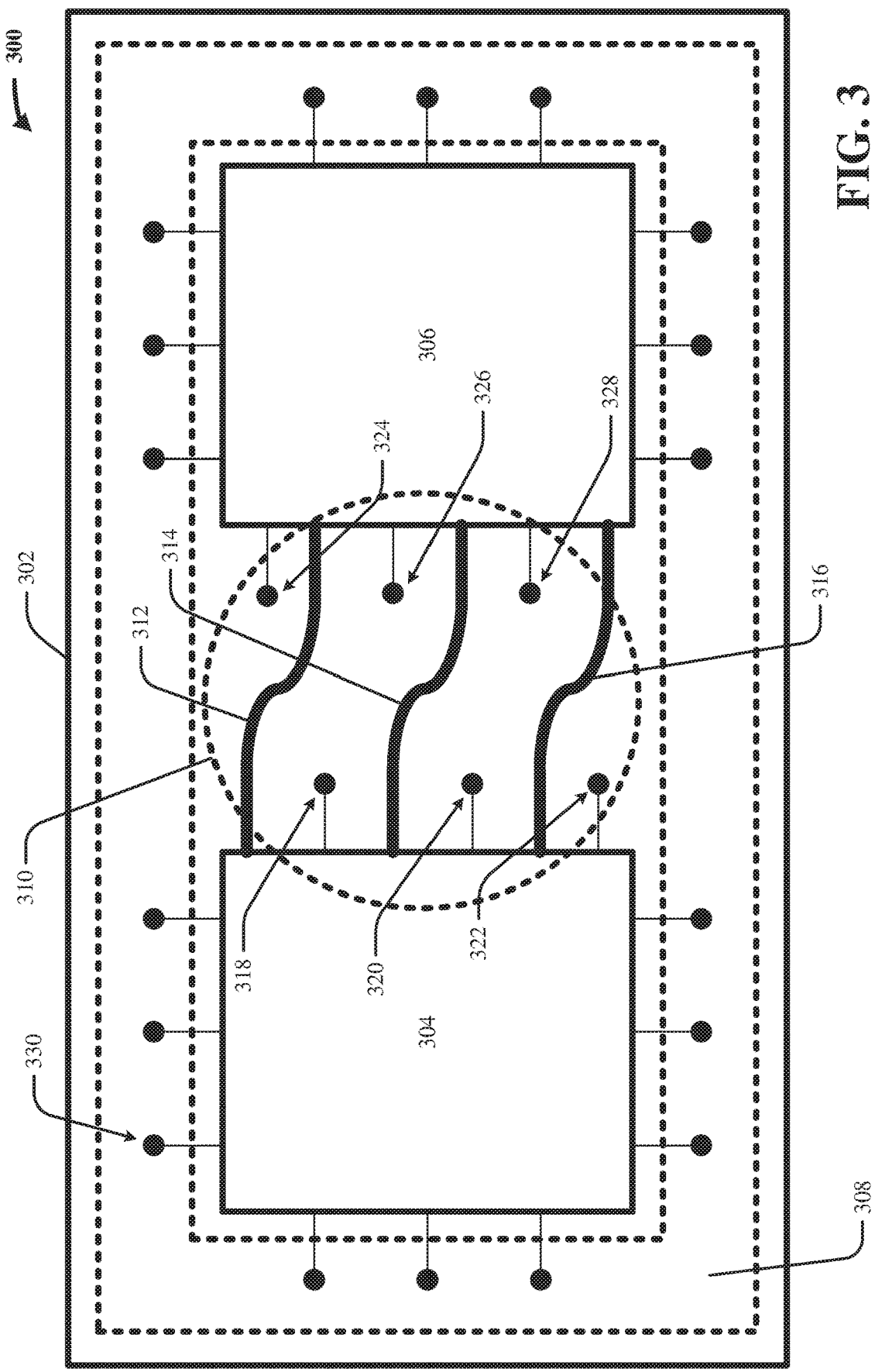
FIG. 3 illustrates a block diagram of an example, non-limiting interposer that facilitates hybrid readout packaging for quantum multichip bonding in accordance with one or more embodiments described herein.

FIG. 3 illustrates a block diagram of an example, non-limiting interposer 302 that can facilitate hybrid readout packaging for quantum multichip bonding in accordance with one or more embodiments described herein. As shown, the interposer 302 can have quantum chips bonded to it (e.g., quantum chip 304 and quantum chip 306). In various embodiments, any suitable number of quantum chips can be arranged in any suitable pattern, shape, and/or fashion on the interposer 302. In various aspects, the quantum chip 304 and/or the quantum chip 306 can have any suitable number and/or any suitable types of qubits (as shown in FIG. 1, and not shown in FIG. 3 for simplicity). In various instances, the quantum chip 304 can have one or more corresponding quantum input/output (I/O) ports 330. In some cases, the quantum chip 304 can have a quantum I/O port 330 for each qubit on the quantum chip 304. In various aspects, the quantum chip 304 can be coupled to its one or more corresponding quantum I/O ports 330 by one or more corresponding quantum I/O lines. Similarly, the quantum chip 306 can, in various cases, have one or more corresponding quantum I/O ports 330 (e.g., one for each qubit on the quantum chip 306). In various instances, the quantum chip 306 can be coupled to its one or more corresponding quantum I/O ports 330 by one or more corresponding quantum I/O lines.

As shown, the interposer 302 can, in various cases, have a peripheral region 308 and an inner region 310. In various aspects, the peripheral region 308 can be an annular and/or perimetral surface area of the interposer 302 that substantially circumscribes and/or surrounds the quantum chips on the interposer 302 (e.g., in the example shown, the peripheral region 308 can be an edge/periphery of the interposer 302 that circumscribes and/or surrounds the quantum chip 304 and the quantum chip 306). In various aspects, the inner region 310 can be a surface area of the interposer 302 that is physically situated between adjacent quantum chips (e.g., the quantum chip 304 is adjacent to the quantum chip 306 on the interposer 302, and the surface area of the interposer 302 that is physically located/positioned/situated between the quantum chip 304 and the quantum chip 306 can be considered the inner region 310).

As shown, the quantum chip 304 and the quantum chip 306 can be coupled together by any suitable number of cross-chip lines (e.g., 312-316). In various aspects, the cross-chip lines 312-316 can exhibit any suitable shapes and/or can comprise any suitable materials for communicatively and/or electrically coupling the quantum chip 304 to the quantum chip 306.

As shown, in various instances, some of the quantum I/O ports 330 of the quantum chip 304 and the quantum chip 306 can be routed and/or wired to the peripheral region 308. As shown, in various instances, others of the quantum I/O ports 330 of the quantum chip 304 and the quantum chip 306 can be routed and/or wired to the inner region 310 (e.g., the quantum I/O ports 318-322 of the quantum chip 304 are located/positioned/situated on the inner region 310, and the quantum I/O ports 324-328 of the quantum chip 306 are located/positioned/situated on the inner region 310). In various aspects, routing, wiring, bonding, locating, positioning, and/or situating the quantum I/O ports 318-328 on the inner region 310 can reduce a number of crossings between the quantum I/O lines and the cross-chip lines 312-316. For instance, if the quantum I/O port 318 were instead bonded to the peripheral region 308, the quantum I/O line coupling the quantum chip 304 to the quantum I/O port 318 would have to either traverse the cross-chip line 312, traverse the cross-chip lines 314 and 316, or traverse inter-qubit couplings on the quantum chip 304 itself. In various cases, if the quantum I/O port 320 were instead bonded to the peripheral region 308, the quantum I/O line coupling the quantum chip 304 to the quantum I/O port 320 would have to either traverse the cross-chip lines 312 and 314, traverse the cross-chip line 316, or traverse inter-qubit couplings on the quantum chip 304 itself. Similarly, if the quantum I/O port 326 were instead bonded to the peripheral region 308, the quantum I/O line coupling the quantum chip 306 to the quantum I/O port 326 would have to either traverse the cross-chip line 312, traverse the cross-chip lines 314 and 316, or traverse inter-qubit couplings on the quantum chip 306 itself. In various cases, if the quantum I/O port 328 were instead bonded to the peripheral region 308, the quantum I/O line coupling the quantum chip 306 to the quantum I/O port 328 would have to either traverse the cross-chip lines 312 and 314, traverse the cross-chip line 316, or traverse inter-qubit couplings on the quantum chip 306 itself. In various embodiments, such crossings/traversals can be reduced by placing the quantum I/O ports 318-328 on the inner region 310 (e.g., as shown, the quantum I/O lines coupling the quantum I/O ports 318-322 to the quantum chip 304 do not cross and/or intersect the cross-chip lines 312-316, and the quantum I/O lines coupling the quantum I/O ports 324-328 to the quantum chip 306 do not cross and/or intersect the cross-chip lines 312-316). In various instances, as shown, the quantum I/O ports 322 and 324 can be unconstrained by the cross-chip lines 312-316 (e.g., can have an unobstructed path to the peripheral region 308). Thus, in various embodiments, the quantum I/O ports 322 and 324 could be placed on the peripheral region 308 without crossing at least one of the cross-chip lines 312-316 or at least one inter-qubit coupling on the quantum chip 304 or on the quantum chip 306.

In various embodiments, electrodes of a printed circuit board can be coupled to the quantum I/O ports 318-328 by pins that are skew (e.g., non-intersecting and non-parallel) to the cross-chip lines 312-316 (e.g., one end of a conducting pin can be coupled to one of the quantum I/O ports 318-328, another end of the conducting pin can be coupled to an electrode of the printed circuit board, and the conducting pin can extend away from the interposer 302 at any suitable non-zero angle of elevation). The result can be that the conducting pins and the quantum I/O lines associated with the quantum I/O ports 318-328 do not cross and/or intersect with the cross-chip lines 312-316.

In various embodiments, the interposer 302 can have quantum chips. In various aspects, the interposer 302 can have quantum I/O ports situated between adjacent pairs of the quantum chips. In various cases, the interposer can include cross-chip lines coupling the adjacent pairs of the quantum chips, where the cross-chip lines can be situated between the adjacent pairs of the quantum chips. In some aspects, the quantum I/O ports can be situated between the cross-chip lines. In various embodiments, a printed circuit board can be coupled to the quantum I/O ports by pins that are skew (e.g., non-parallel and non-intersecting) to the cross-chip lines.

In various embodiments, a hybrid readout package for quantum multichip bonding can include an electrical conductor that couples a readout resonator on an inner portion of an interposer to an electrode of a printed circuit board. In various cases, the electrical conductor can be skew (e.g., non-parallel and non-intersecting) to connection buses on the interposer. In various aspects, the electrical conductor can comprise a pogo pin, a land grid array, and/or a through-silicon via.

Figure 4:
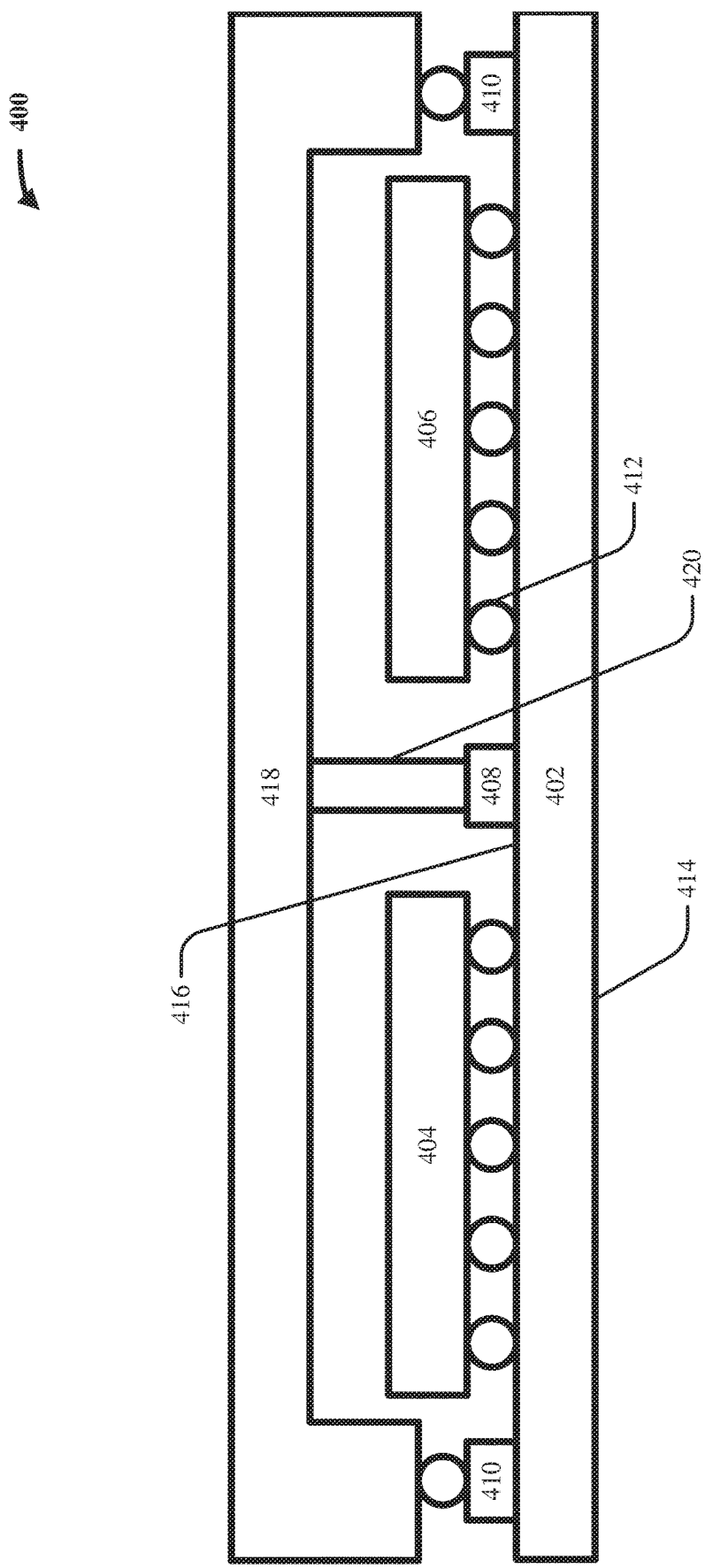
FIG. 4 illustrates a block diagram of an example, non-limiting quantum multichip bonded device including a pogo pin that facilitates hybrid readout packaging for quantum multichip bonding in accordance with one or more embodiments described herein.

FIG. 4 illustrates a block diagram of an example, non-limiting quantum multichip bonded device 400 including a pogo pin that can facilitate hybrid readout packaging for quantum multichip bonding in accordance with one or more embodiments described herein. In various cases, FIG. 4 can depict a cross-sectional and/or profile view of a hybrid readout package for quantum multichip bonding. As shown, an interposer 402 can have a quantum chip 404 and a quantum chip 406. In various instances, any suitable number and/or arrangement of quantum chips can be on the interposer 402. In various aspects, the quantum chip 404 and the quantum chip 406 can be bonded (e.g., bump bonded via the bump bonds 412, and/or bonded via any other suitable technique) to the interposer 402. In various cases, the interposer 402 can have one or more quantum input/output ports 408 (e.g., readout resonators) placed on an inner portion of the interposer 402 between the quantum chip 404 and the quantum chip 406. In various aspects, the interposer 402 can have one or more quantum input/output ports 410 (e.g., readout resonators) placed on a peripheral portion of the interposer 402. In various aspects, the interposer 402 can have a front side 416 and a back side 414.

In various instances, the quantum input/output ports 408 can be coupled to corresponding electrodes on a printed circuit board 418. In various aspects, this coupling can be facilitated by one or more pogo pins 420. For instance, in some cases, each of the quantum input/output ports 408 can be coupled to one end of a corresponding pogo pin, with the other end of the corresponding pogo pin being coupled to a corresponding electrode on the printed circuit board 418. In various aspects, the pogo pins 420 can extend out and/or away from the interposer 402 at any suitable angle, such that the pogo pin is not coplanar with the interposer 402. This can cause the pogo pin 420 to not cross and/or intersect any connection buses and/or cross-chip resonators on the interposer 402. As shown, in some cases, the printed circuit board 418 can be substantially parallel with the interposer 402 and can oppose the front side 416 of the interposer 402.

In various instances, the quantum input/output ports 410 (e.g., located on the peripheral portion of the interposer 402) can be bonded to corresponding electrodes of the printed circuit board 418 by any suitable bonding technique (e.g., bump bonding as shown, wire bonding, pogo pins, and/or any other suitable technique)

Figure 5:
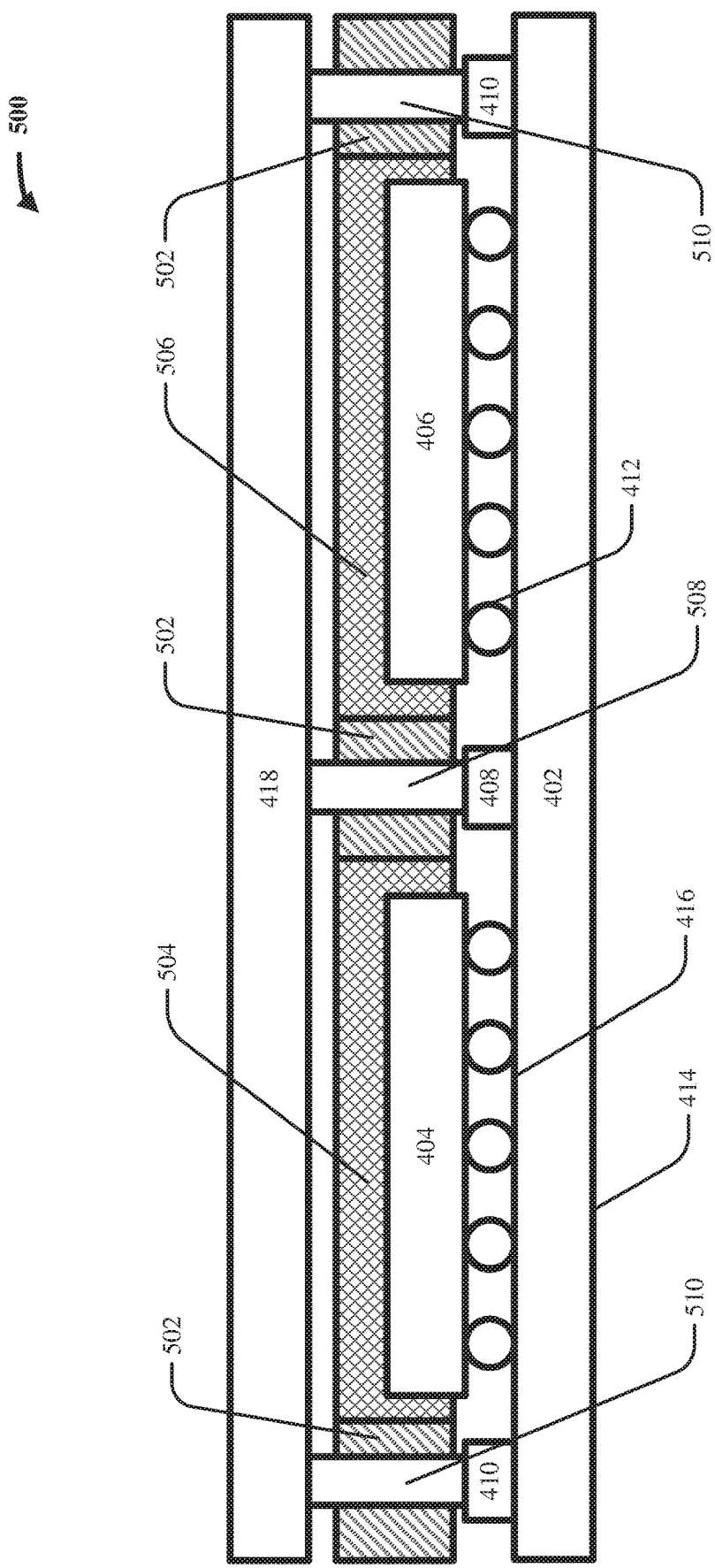
FIG. 5 illustrates a block diagram of an example, non-limiting quantum multichip bonded device including a land grid array that facilitates hybrid readout packaging for quantum multichip bonding in accordance with one or more embodiments described herein.

FIG. 5 illustrates a block diagram of an example, non-limiting quantum multichip bonded device 500 including a land grid array that can facilitate hybrid readout packaging for quantum multichip bonding in accordance with one or more embodiments described herein. In various cases, FIG. 5 can depict a cross-sectional and/or profile view of a hybrid readout package for quantum multichip bonding. As shown, the interposer 402 can have a quantum chip 404 and a quantum chip 406. In various cases, the interposer 402 can have the one or more quantum input/output ports 408 (e.g., readout resonators) placed on an inner portion of the interposer 402 between the quantum chip 404 and the quantum chip 406. In various aspects, the interposer 402 can have the one or more quantum input/output ports 410 (e.g., readout resonators) placed on a peripheral portion of the interposer 402. In various aspects, the interposer 402 can have the front side 416 and the back side 414.

In various instances, the quantum input/output ports 408 and 410 can be coupled to corresponding electrodes on the printed circuit board 418. In various aspects, this coupling can be facilitated by a land grid array 502. In various instances, the land grid array 502 can include a socket 504 (e.g., a cut-out) for the quantum chip 404 and a socket 506 (e.g., a cut-out) for the quantum chip 406. In various aspects, the land grid array 502 can include pins 508 corresponding to the quantum input/output ports 408 (e.g., located on the inner portion of the interposer 402), with the pins 508 coupling the quantum input/output ports 408 to corresponding electrodes on the printed circuit board 418. In various aspects, the land grid array 502 can include pins 510 corresponding to the quantum input/output ports 410 (e.g., located on the peripheral portion of the interposer 402), with the pins 510 coupling the quantum input/output ports 410 to corresponding electrodes on the printed circuit board 418. As shown, in various instances, the printed circuit board 418 can be substantially parallel to the interposer 402 and can oppose the front side 416 of the interposer 402.

Figure 6:
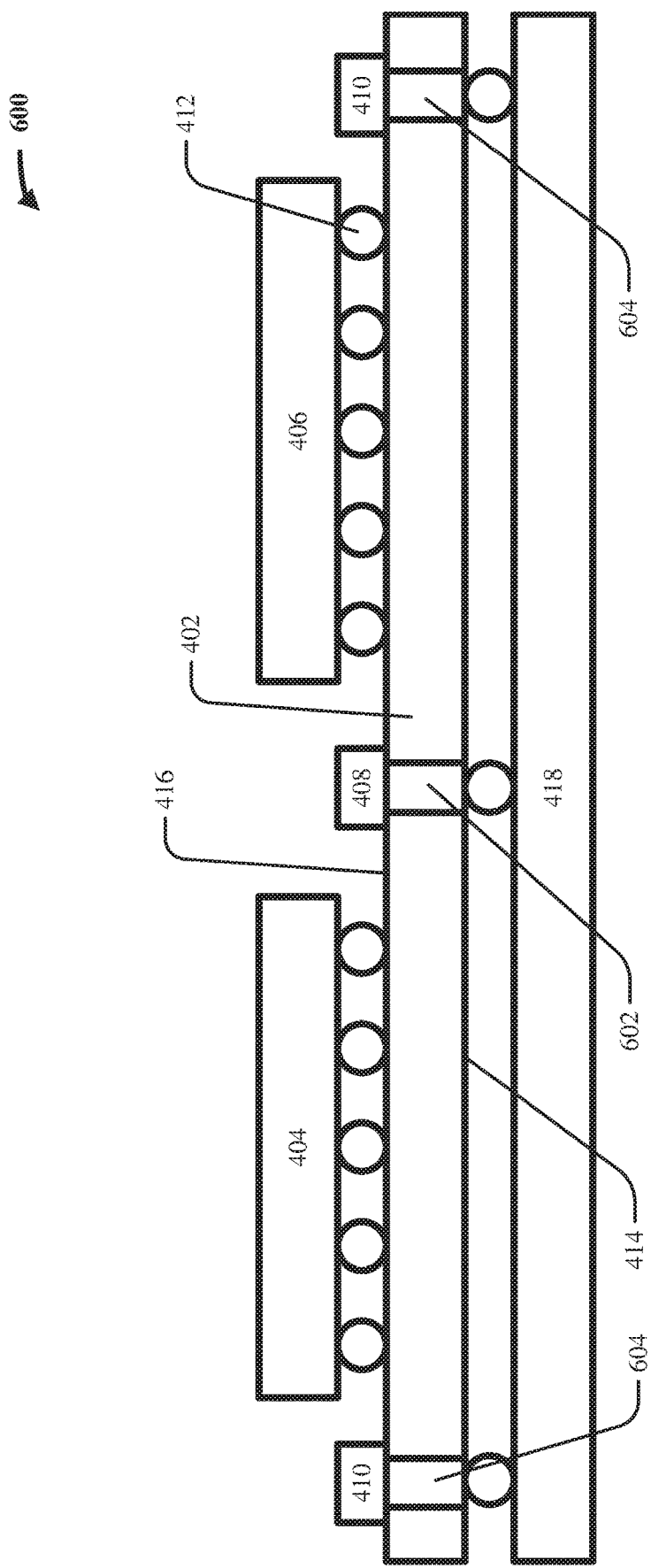
FIG. 6 illustrates a block diagram of an example, non-limiting quantum multichip bonded device including a through-silicon via that facilitates hybrid readout packaging for quantum multichip bonding in accordance with one or more embodiments described herein.

FIG. 6 illustrates a block diagram of an example, non-limiting quantum multichip bonded device 600 including a through-silicon via that can facilitate hybrid readout packaging for quantum multichip bonding in accordance with one or more embodiments described herein. In various cases, FIG. 6 can depict a cross-sectional and/or profile view of a hybrid readout package for quantum multichip bonding. As shown, the interposer 402 can have a quantum chip 404 and a quantum chip 406. In various cases, the interposer 402 can have the one or more quantum input/output ports 408 (e.g., readout resonators) placed on an inner portion of the interposer 402 between the quantum chip 404 and the quantum chip 406. In various aspects, the interposer 402 can have the one or more quantum input/output ports 410 (e.g., readout resonators) placed on a peripheral portion of the interposer 402. In various aspects, the interposer 402 can have the front side 416 and the back side 414.

In various instances, the quantum input/output ports 408 and 410 can be coupled to corresponding electrodes on the printed circuit board 418. In various aspects, this coupling can be facilitated by through-silicon vias 602 and 604. In various instances, one or more through-silicon vias 602 can correspond to the one or more quantum input/output ports 408 (e.g., located on the inner portion of the interposer 402). In such cases, the through-silicon vias 602 can pass through the interposer 402 from the front side 416 to the back side 414. Similarly, one or more through-silicon vias 604 can correspond to the one or more quantum input/output ports 410 (e.g., located on the peripheral portion of the interposer 402). In such cases, the through-silicon vias 604 can pass through the interposer 402 from the front side 416 to the back side 414. In various aspects, this can facilitate coupling the printed circuit board 418 to the back side 414 of the interposer 402, rather than to the front side 416 of the interposer 402. In various aspects, corresponding electrodes of the printed circuit board 418 can be bonded (e.g., bump bonded, and/or bonded via any other suitable technique) to the through-silicon vias 602 and 604, such that the printed circuit board 418 is substantially parallel with the interposer 402, and such that the printed circuit board 418 opposes the back side 414 of the interposer 402.

Figure 7:
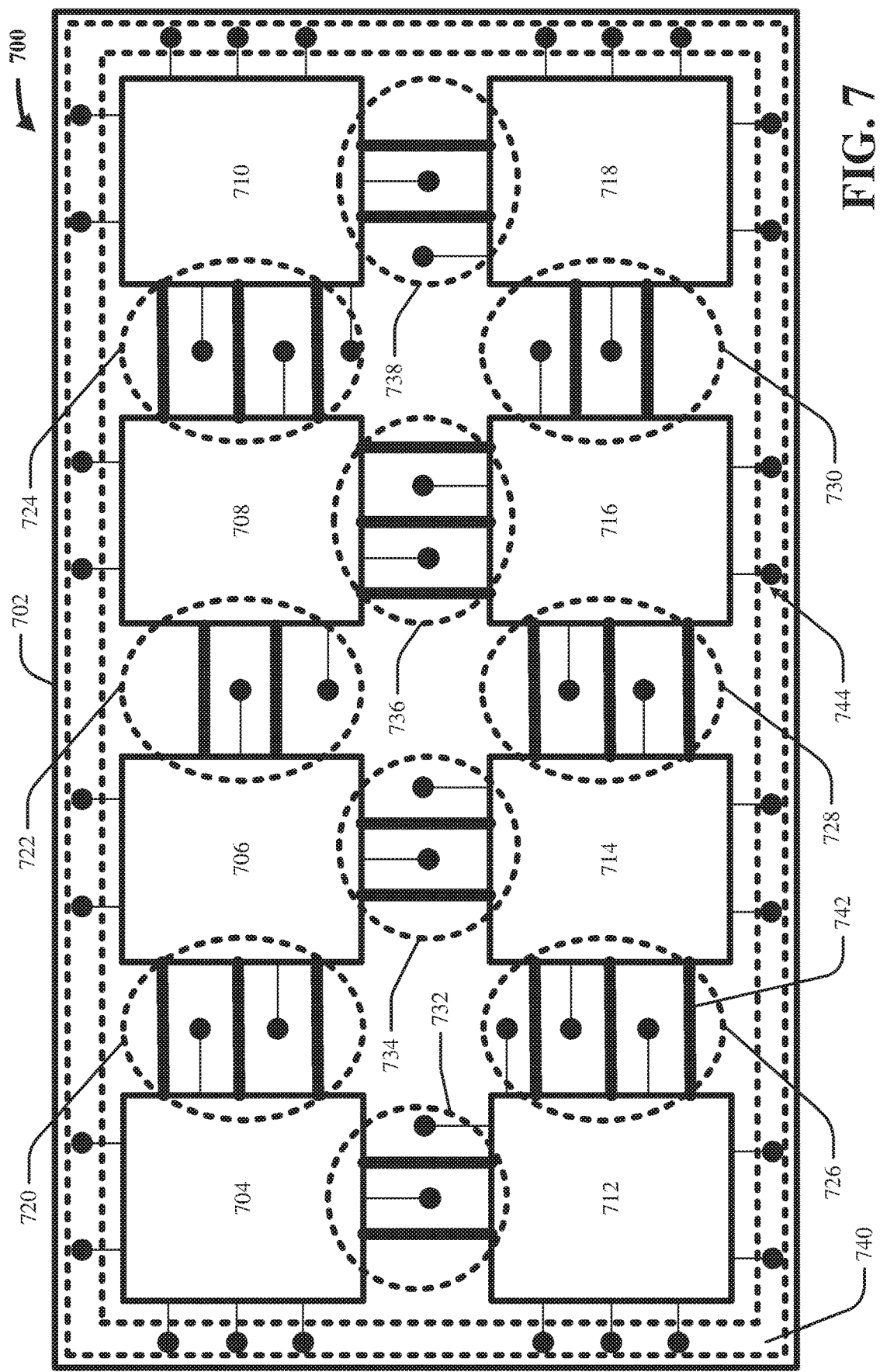
FIG. 7 illustrates a block diagram of an example, non-limiting quantum multichip bonded apparatus that facilitates hybrid readout packaging for quantum multichip bonding in accordance with one or more embodiments described herein.

FIG. 7 illustrates a block diagram of an example, non-limiting quantum multichip bonded apparatus 700 that can facilitate hybrid readout packaging for quantum multichip bonding in accordance with one or more embodiments described herein. As shown, a substrate 702 can have one or more qubit chips 704-718 bonded to it. In various aspects, each of the qubit chips 704-718 can have one or more qubits bonded thereto. As shown, the qubit chips 704-718 can be arranged on the substrate 702 as a two-by-four array. In various embodiments, any suitable number of qubit chips can be arranged in any suitable shape, pattern, and/or fashion on the substrate 702.

In various aspects, the substrate 702 can have a peripheral region 740 and one or more inner regions 720-738. In various cases, the peripheral region 740 can be a surface area of the substrate 702 that substantially surrounds the one or more qubit chips 704-718. In various cases, the one or more inner regions 720-738 can be one or more surface areas of the substrate 702 that are physically between adjacent pairs of the qubit chips 704-718. For instance, the qubit chip 704 is adjacent to the qubit chip 706. Thus, the qubit chip 704 and the qubit chip 706 can define an inner region 720 that is physically between the qubit chip 704 and the qubit chip 706. Moreover, as shown, the qubit chip 704 is also adjacent to the qubit chip 712. Thus, the qubit chip 704 and the qubit chip 712 can define an inner region 732 that is physically between the qubit chip 704 and the qubit chip 712. As another example, consider the qubit chip 716. The qubit chip 716 is adjacent to the qubit chip 714, to the qubit chip 708, and to the qubit chip 718. Thus, the qubit chip 716 and the qubit chip 714 can define an inner region 728, the qubit chip 716 and the qubit chip 708 can define an inner region 736, and the qubit chip 716 and the qubit chip 718 can define an inner region 730. In this way, adjacent pairs of the qubit chips 704-718 on the substrate 702 can define the one or more inner regions 720-738.

As shown, the adjacent pairs of the one or more qubit chips 704-718 can be coupled together by buses 742 positioned on the one or more inner regions 720-738. For instance, the qubit chip 714 is adjacent to the qubit chip 712, to the qubit chip 706, and to the qubit chip 716. Thus, the qubit chip 714 can be coupled by one or more buses 742 to the qubit chip 712 (e.g., in the example shown, three buses 742 are coupling the qubit chip 714 to the qubit chip 712), the qubit chip 714 can be coupled by one or more buses 742 to the qubit chip 706 (e.g., in the example shown, two buses 742 are coupling the qubit chip 714 to the qubit chip 706), and the qubit chip 714 can be coupled by one or more buses 742 to the qubit chip 716 (e.g., in the example shown, three buses 742 are coupling the qubit chip 714 to the qubit chip 716). In some cases, non-adjacent qubit chips can be coupled together.

In various aspects, each of the one or more qubit chips 704-718 can have one or more resonators 744 (e.g., input/output ports) for providing input to and/or receiving output from qubits on the one or more qubit chips 704-718. In various embodiments, some of the resonators 744 can be routed/wired to the peripheral region 740 (e.g., input/output ports of qubits that have an unobstructed path to the peripheral region 740 and/or that have no alternative path with fewer crossings). In various embodiments, some of the resonators 744 can be routed/wired to the one or more inner regions 720-738 (e.g., input/output ports of qubits that do not have an unobstructed path to the peripheral region 740). As explained at length above, this can reduce a number of crossings between input/output lines and buses 742 on the substrate 702, which therefore can improve quantum computing performance of the quantum multichip bonded apparatus 700.

In various instances, as shown, one or more resonators 744 can be routed/wired to the inner regions 720-738 such that they are between the buses 742. This can be beneficial since, in various instances, there can be an unobstructed path from various qubits of a qubit chip to at least one of the one or more inner regions 720-738. For example, consider the qubit chip 704. As shown, the qubit chip 704 is coupled by two buses 742 to the qubit chip 712. As shown, there can be a resonator 744 of the qubit chip 704 in the inner region 732, such that the resonator 744 is between those two buses 742. If that resonator 744 were instead routed/wired to the peripheral region 740, the readout line coupling that resonator 744 to the qubit chip 704 would either have to cross/traverse one of those two buses 742 and/or would have to cross/traverse inter-qubit couplings that are located on the qubit chip 704 itself. In various cases, such crossings can be avoided by routing/wiring the resonator 744 to the inner region 732 between the two buses 742.

In various embodiments, the one or more resonators 744 can be coupled to a printed circuit board (e.g., to electrodes of a printed circuit board) via one or more conductors (for example as shown in FIGS. 4-6) that are skew to the buses 742 (e.g., that do not intersect and are not parallel with the buses 742). In various instances, the one or more conductors can be any of pogo pins, land grid arrays, through-silicon vias, any other suitable electrical couplings, and/or any suitable combination thereof.

In various embodiments, the size of an interposer/substrate can be increased so as to accommodate more quantum/qubit chips. In various instances, a size of the quantum/qubit chips can fit within a stepper field of exposure (e.g., each quantum/qubit chip can have fewer than about 50 and/or 60 qubits). In various cases, any suitable number of qubits and any suitable number of quantum/qubit chips can be implemented.

Figure 8:
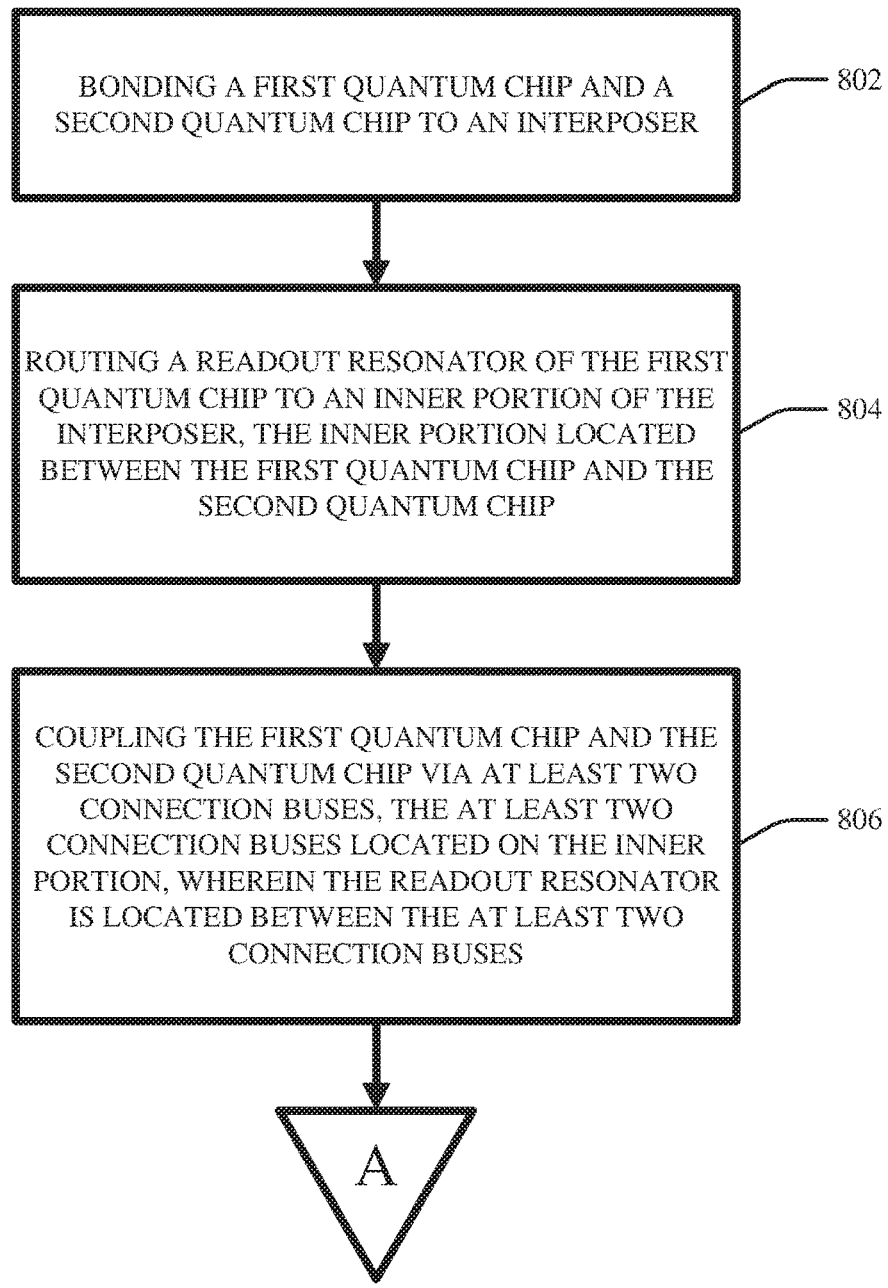
FIGS. 8-10 illustrate flow diagrams of example, non-limiting methods of manufacturing a quantum multichip bonded device that facilitates hybrid readout packaging for quantum multichip bonding in accordance with one or more embodiments described herein.
Figure 9:
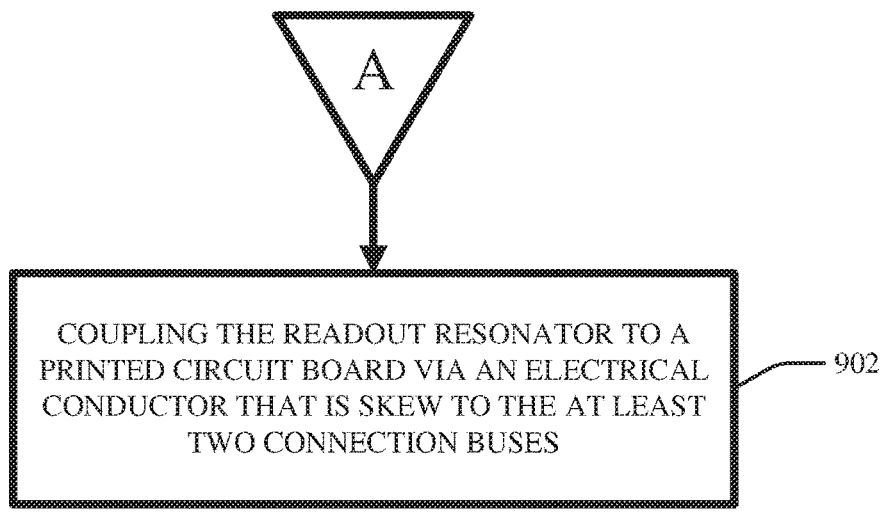
Figure 10:
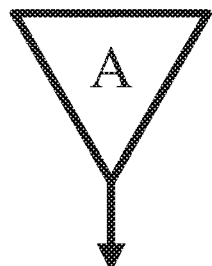

FIGS. 8-10 illustrate flow diagrams of example, non-limiting methods 800, 900, and 1000 of manufacturing a quantum multichip bonded device that can facilitate hybrid readout packaging for quantum multichip bonding in accordance with one or more embodiments described herein.

In various embodiments, act 802 can include bonding a first quantum chip (e.g., 104 and/or 304) and a second quantum chip (e.g., 106 and/or 306) to an interposer (e.g., 102 and/or 302).

In various aspects, act 804 can include routing and/or wiring a readout resonator (e.g., 128 and/or 318) of the first quantum chip to an inner portion (e.g., 126 and/or 310) of the interposer. In various instances, the inner portion can be located between the first quantum chip and the second quantum chip.

In various aspects, act 806 can include coupling the first quantum chip and the second quantum chip via at least two connection buses (e.g., 108 and/or 312-316), the at least two connection buses located on the inner portion. In various aspects, the readout resonator can be located between the at least two connection buses.

In various embodiments, act 902 can include coupling the readout resonator to a printed circuit board (e.g., 418) via an electrical conductor (e.g., 420, 508, and/or 602) that is skew to the at least two connection buses.

In various embodiments, act 1002 can include routing and/or wiring a second readout resonator of the first quantum chip to a peripheral portion (e.g., 116 and/or 308) of the interposer, the peripheral portion circumscribing the first quantum chip and the second quantum chip.

Figure 11:
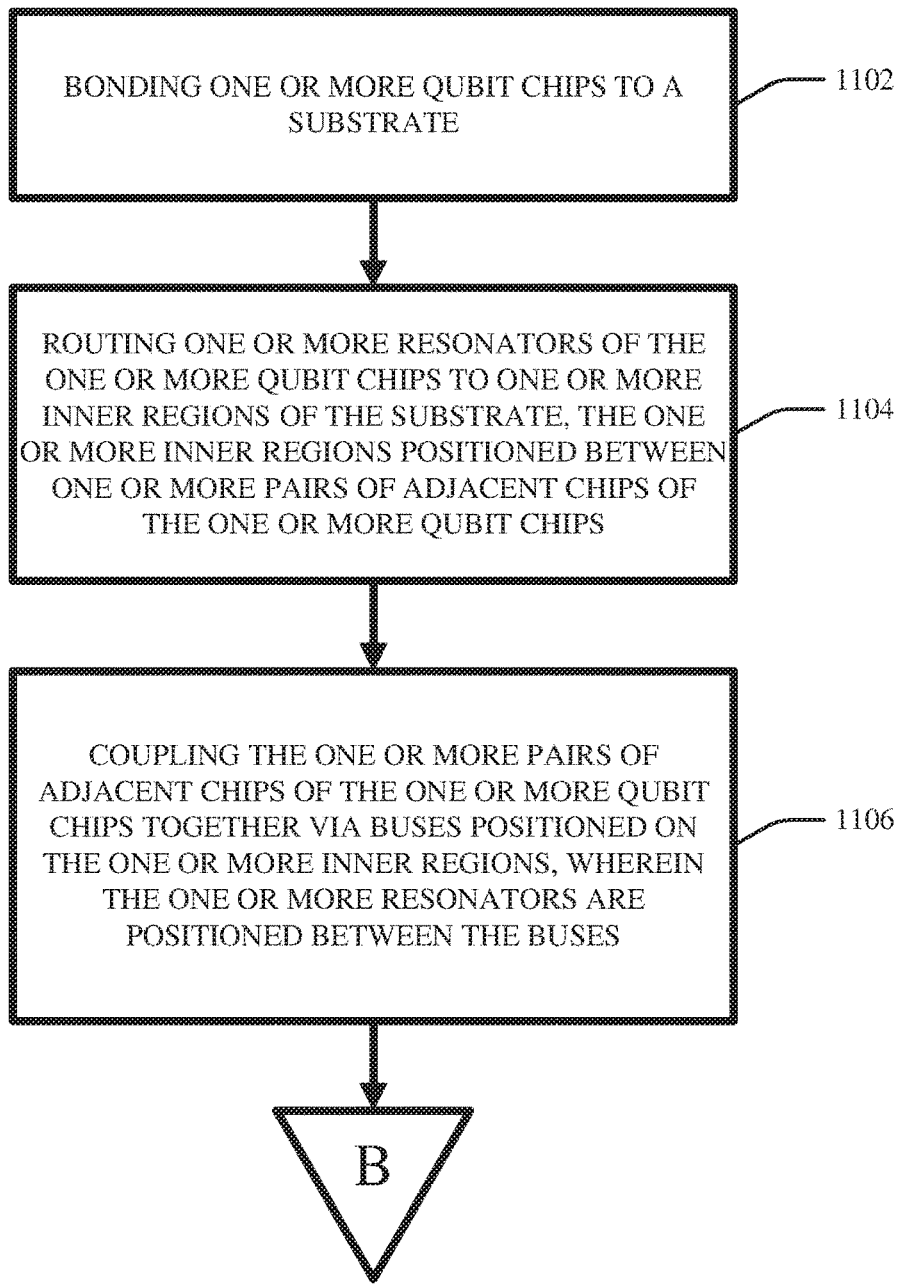
FIGS. 11-12 illustrate flow diagrams of example, non-limiting methods of manufacturing a quantum multichip bonded apparatus that facilitates hybrid readout packaging for quantum multichip bonding in accordance with one or more embodiments described herein.
Figure 12:
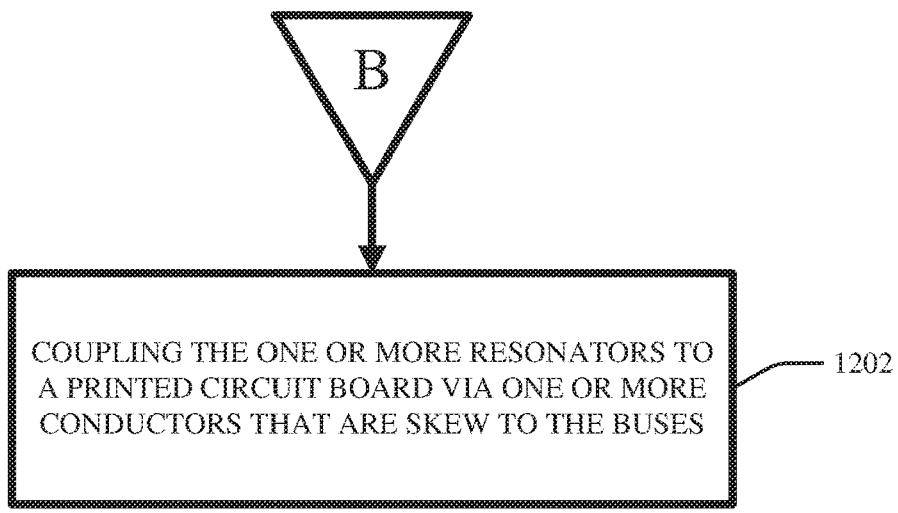

FIGS. 11-12 illustrate flow diagrams of example, non-limiting methods 1100 and 1200 of manufacturing a quantum multichip bonded apparatus that facilitates hybrid readout packaging for quantum multichip bonding in accordance with one or more embodiments described herein.

In various embodiments, act 1102 can include bonding one or more qubit chips (e.g., 704-718) to a substrate (e.g., 702).

In various aspects, act 1104 can include routing and/or wiring one or more resonators (e.g., 744) of the one or more qubit chips to one or more inner regions (e.g., 720-738) of the substrate, the one or more inner regions being positioned between one or more pairs of adjacent chips of the one or more qubit chips.

In various instances, act 1106 can include coupling the one or more pairs of adjacent chips of the one or more qubit chips together via buses (e.g., 742) positioned on the one or more inner regions, wherein the one or more resonators are positioned between the buses.

In various instances, act 1202 can include coupling the one or more resonators to a printed circuit board (e.g., 418) via one or more conductors (e.g., 420, 508, and/or 602) that are skew to the buses.

Figure 13:
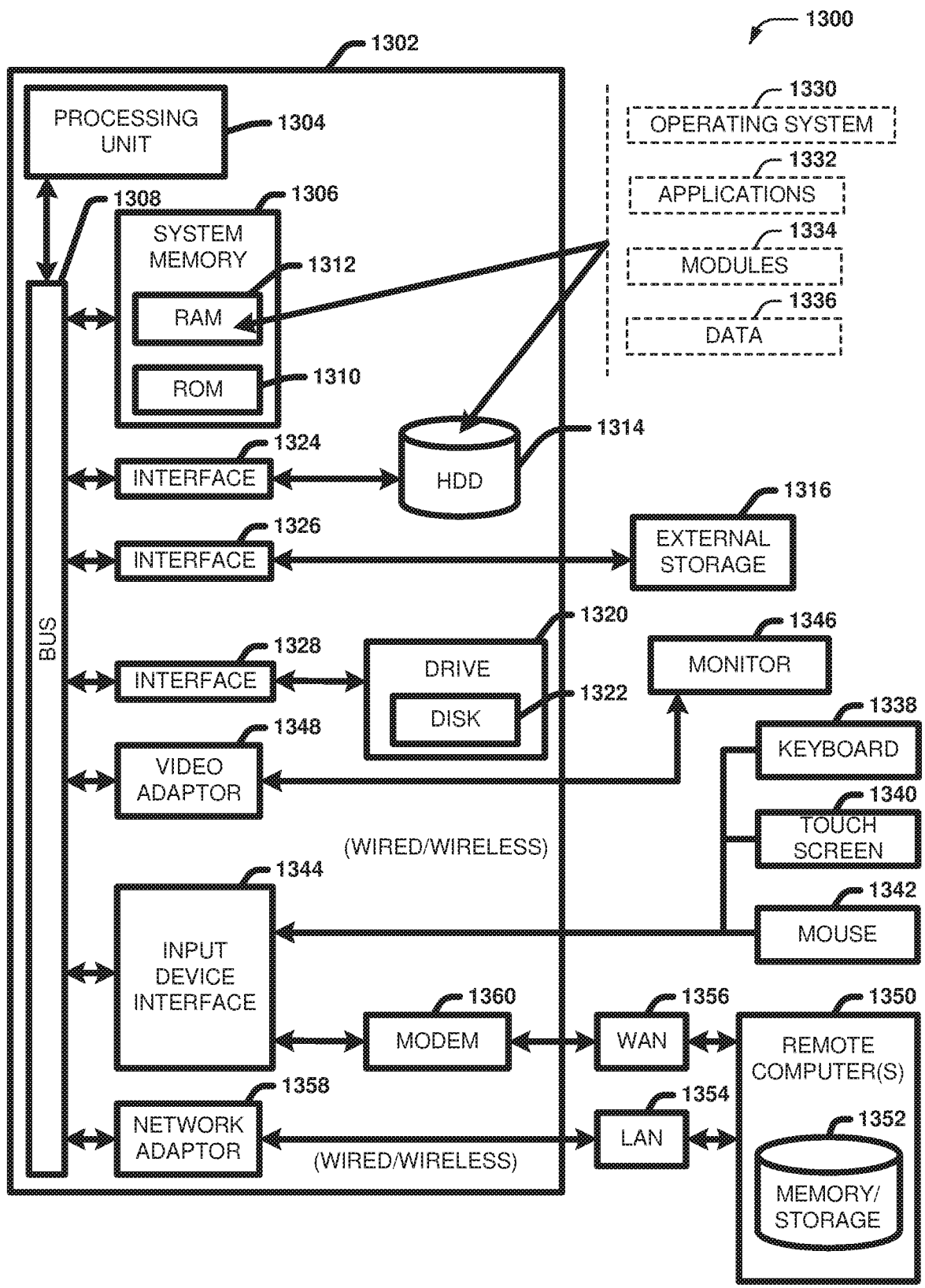
FIG. 13 illustrates a block diagram of an example, non-limiting operating environment in which one or more embodiments described herein can be facilitated.

In order to provide additional context for various embodiments described herein, FIG. 13 and the following discussion are intended to provide a general description of a suitable computing environment 1300 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 13, the example environment 1300 for implementing various embodiments of the aspects described herein includes a computer 1302, the computer 1302 including a processing unit 1304, a system memory 1306 and a system bus 1308. The system bus 1308 couples system components including, but not limited to, the system memory 1306 to the processing unit 1304. The processing unit 1304 can be any of various commercially available processors. Dual microprocessors and other multi-processor architectures can also be employed as the processing unit 1304.

The system bus 1308 can be any of several types of bus structure that can further interconnect to a memory bus (with or without a memory controller), a peripheral bus, and a local bus using any of a variety of commercially available bus architectures. The system memory 1306 includes ROM 1310 and RAM 1312. A basic input/output system (BIOS) can be stored in a non-volatile memory such as ROM, erasable programmable read only memory (EPROM), EEPROM, which BIOS contains the basic routines that help to transfer information between elements within the computer 1302, such as during startup. The RAM 1312 can also include a high-speed RAM such as static RAM for caching data.

The computer 1302 further includes an internal hard disk drive (HDD) 1314 (e.g., EIDE, SATA), one or more external storage devices 1316 (e.g., a magnetic floppy disk drive (FDD) 1316, a memory stick or flash drive reader, a memory card reader, etc.) and a drive 1320, e.g., such as a solid state drive, an optical disk drive, which can read or write from a disk 1322, such as a CD-ROM disc, a DVD, a BD, etc. Alternatively, where a solid state drive is involved, disk 1322 would not be included, unless separate. While the internal HDD 1314 is illustrated as located within the computer 1302, the internal HDD 1314 can also be configured for external use in a suitable chassis (not shown). Additionally, while not shown in environment 1300, a solid state drive (SSD) could be used in addition to, or in place of, an HDD 1314. The HDD 1314, external storage device(s) 1316 and drive 1320 can be connected to the system bus 1308 by an HDD interface 1324, an external storage interface 1326 and a drive interface 1328, respectively. The interface 1324 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1302, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1312, including an operating system 1330, one or more application programs 1332, other program modules 1334 and program data 1336. All or portions of the operating system, applications, modules, and/or data can also be cached in the RAM 1312. The systems and methods described herein can be implemented utilizing various commercially available operating systems or combinations of operating systems.

Computer 1302 can optionally comprise emulation technologies. For example, a hypervisor (not shown) or other intermediary can emulate a hardware environment for operating system 1330, and the emulated hardware can optionally be different from the hardware illustrated in FIG. 13. In such an embodiment, operating system 1330 can comprise one virtual machine (VM) of multiple VMs hosted at computer 1302. Furthermore, operating system 1330 can provide runtime environments, such as the Java runtime environment or the .NET framework, for applications 1332. Runtime environments are consistent execution environments that allow applications 1332 to run on any operating system that includes the runtime environment. Similarly, operating system 1330 can support containers, and applications 1332 can be in the form of containers, which are lightweight, standalone, executable packages of software that include, e.g., code, runtime, system tools, system libraries and settings for an application.

Further, computer 1302 can be enable with a security module, such as a trusted processing module (TPM). For instance with a TPM, boot components hash next in time boot components, and wait for a match of results to secured values, before loading a next boot component. This process can take place at any layer in the code execution stack of computer 1302, e.g., applied at the application execution level or at the operating system (OS) kernel level, thereby enabling security at any level of code execution.

A user can enter commands and information into the computer 1302 through one or more wired/wireless input devices, e.g., a keyboard 1338, a touch screen 1340, and a pointing device, such as a mouse 1342. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1304 through an input device interface 1344 that can be coupled to the system bus 1308, but can be connected by other interfaces, such as a parallel port, an IEEE 1394 serial port, a game port, a USB port, an IR interface, a BLUETOOTH® interface, etc.

A monitor 1346 or other type of display device can be also connected to the system bus 1308 via an interface, such as a video adapter 1348. In addition to the monitor 1346, a computer typically includes other peripheral output devices (not shown), such as speakers, printers, etc.

The computer 1302 can operate in a networked environment using logical connections via wired and/or wireless communications to one or more remote computers, such as a remote computer(s) 1350. The remote computer(s) 1350 can be a workstation, a server computer, a router, a personal computer, portable computer, microprocessor-based entertainment appliance, a peer device or other common network node, and typically includes many or all of the elements described relative to the computer 1302, although, for purposes of brevity, only a memory/storage device 1352 is illustrated. The logical connections depicted include wired/wireless connectivity to a local area network (LAN) 1354 and/or larger networks, e.g., a wide area network (WAN) 1356. Such LAN and WAN networking environments are commonplace in offices and companies, and facilitate enterprise-wide computer networks, such as intranets, all of which can connect to a global communications network, e.g., the Internet.

When used in a LAN networking environment, the computer 1302 can be connected to the local network 1354 through a wired and/or wireless communication network interface or adapter 1358. The adapter 1358 can facilitate wired or wireless communication to the LAN 1354, which can also include a wireless access point (AP) disposed thereon for communicating with the adapter 1358 in a wireless mode.

When used in a WAN networking environment, the computer 1302 can include a modem 1360 or can be connected to a communications server on the WAN 1356 via other means for establishing communications over the WAN 1356, such as by way of the Internet. The modem 1360, which can be internal or external and a wired or wireless device, can be connected to the system bus 1308 via the input device interface 1344. In a networked environment, program modules depicted relative to the computer 1302 or portions thereof, can be stored in the remote memory/storage device 1352. It will be appreciated that the network connections shown are example and other means of establishing a communications link between the computers can be used.

When used in either a LAN or WAN networking environment, the computer 1302 can access cloud storage systems or other network-based storage systems in addition to, or in place of, external storage devices 1316 as described above, such as but not limited to a network virtual machine providing one or more aspects of storage or processing of information. Generally, a connection between the computer 1302 and a cloud storage system can be established over a LAN 1354 or WAN 1356 e.g., by the adapter 1358 or modem 1360, respectively. Upon connecting the computer 1302 to an associated cloud storage system, the external storage interface 1326 can, with the aid of the adapter 1358 and/or modem 1360, manage storage provided by the cloud storage system as it would other types of external storage. For instance, the external storage interface 1326 can be configured to provide access to cloud storage sources as if those sources were physically connected to the computer 1302.

The computer 1302 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adaptor card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a standalone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   an interposer having a first quantum chip and a second quantum chip;
   an electrical conductor comprising at least one of a pogo pin or a land grid array; and
   a readout resonator of the first quantum chip routed to an inner portion of the interposer, wherein the inner portion is located between the first quantum chip and the second quantum chip, and the readout resonator is coupled to a printed circuit board by the electrical conductor.

2. The device of claim 1, further comprising:
at least two connection buses coupling the first quantum chip and the second quantum chip, the at least two connection buses located on the inner portion, wherein the readout resonator is located between the at least two connection buses.

3. The device of claim 2, wherein the electrical conductor is skew to the at least two connection buses.

4. The device of claim 3, wherein the printed circuit board is substantially parallel to the interposer and opposes a front side of the interposer.

5. The device of claim 3, wherein the printed circuit board is substantially parallel to the interposer and opposes a front side of the interposer.

6. The device of claim 3, further comprising a second electrical conductor, wherein the second electrical conductor is a through-silicon via, and wherein the printed circuit board is substantially parallel to the interposer and opposes a back side of the interposer.

7. The device of claim 2, further comprising:
a second readout resonator of the first quantum chip routed to a peripheral portion of the interposer, the peripheral portion circumscribing the first quantum chip and the second quantum chip.

8. An apparatus, comprising:
a substrate having one or more qubit chips; and
one or more resonators coupled to qubits on the one or more qubit chips, the one or more resonators routed to one or more inner regions of the substrate such that a routed path between the qubits on the one or more qubit chips and the one or more inner regions positioned between one or more pairs of adjacent chips of the one or more qubit chips is unobstructed.

9. The apparatus of claim 8, wherein the one or more pairs of adjacent chips of the one or more qubit chips are coupled together via buses positioned on the one or more inner regions, wherein the one or more resonators are positioned between the buses.

10. The apparatus of claim 9, wherein the one or more resonators are coupled to a printed circuit board via one or more conductors that are skew to the buses.

11. The apparatus of claim 10, wherein the one or more conductors comprise at least one of pogo pins, land grid arrays, or through-silicon vias.

12. An interposer, comprising:
quantum chips; and
quantum input/output ports routed between adjacent pairs of the quantum chips, wherein the quantum input/output ports are located on a peripheral portion of the interposer.

13. The interposer of claim 12, further comprising:
cross-chip lines coupling the adjacent pairs of the quantum chips, the cross-chip lines located between the adjacent pairs of the quantum chips, wherein the quantum input/output ports are located between the cross-chip lines.

14. The interposer of claim 13, wherein a printed circuit board is coupled to the quantum input/output ports by pins that are skew to the cross-chip lines.

* * * * *